(12) United States Patent
Kang et al.

(10) Patent No.: US 11,721,601 B2
(45) Date of Patent: Aug. 8, 2023

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Hyeongmun Kang, Hwaseong-si (KR); Jungmin Ko, Hwaseong-si (KR); Seungduk Baek, Hwaseong-si (KR); Taehyeong Kim, Suwon-si (KR); Insup Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 122 days.

(21) Appl. No.: 17/095,210

(22) Filed: Nov. 11, 2020

(65) Prior Publication Data
US 2021/0210397 A1    Jul. 8, 2021

(30) Foreign Application Priority Data
Jan. 6, 2020   (KR) .................. 10-2020-0001579

(51) Int. Cl.
| | |
|---|---|
| *H01L 23/24* | (2006.01) |
| *H01L 23/31* | (2006.01) |
| *H01L 21/56* | (2006.01) |
| *H01L 23/538* | (2006.01) |
| *H01L 23/00* | (2006.01) |

(52) U.S. Cl.
CPC ............ *H01L 23/24* (2013.01); *H01L 21/565* (2013.01); *H01L 23/3107* (2013.01); *H01L 23/5385* (2013.01); *H01L 24/13* (2013.01); H01L 2924/1434 (2013.01); H01L 2924/3511 (2013.01)

(58) Field of Classification Search
CPC ....................................................... H01L 23/24
See application file for complete search history.

(56) References Cited

U.S. PATENT DOCUMENTS

| | | | |
|---|---|---|---|
| 9,123,830 B2 | 9/2015 | Nakamura et al. | |
| 9,385,104 B2 | 7/2016 | Tani et al. | |
| 9,564,400 B2 | 2/2017 | Mahnkopf et al. | |
| 9,685,411 B2 | 6/2017 | Chen | |
| 10,153,255 B2 | 12/2018 | Hwang et al. | |
| 2013/0234320 A1* | 9/2013 | Lu | H01L 25/50 257/737 |
| 2015/0130078 A1 | 5/2015 | Hong et al. | |
| 2015/0214207 A1 | 7/2015 | Yoshida | |
| 2017/0338206 A1* | 11/2017 | Seo | H01L 25/0657 |

FOREIGN PATENT DOCUMENTS

| | | |
|---|---|---|
| KR | 1020150054551 | 5/2015 |
| KR | 10-1680428 | 11/2016 |

* cited by examiner

*Primary Examiner* — William A Harriston
(74) *Attorney, Agent, or Firm* — F. Chau & Associates, LLC

(57) ABSTRACT

A semiconductor package includes a substrate, a plurality of semiconductor devices stacked on the substrate, a plurality of underfill fillets disposed between the plurality of semiconductor devices and between the substrate and the plurality of semiconductor devices, and molding resin surrounding the plurality of semiconductor devices. At least one of the underfill fillets is exposed from side surfaces of the molding resin.

21 Claims, 19 Drawing Sheets

SEMICONDUCTOR PACKAGE AND METHOD OF MANUFACTURING THE SAME

CROSS-REFERENCE TO RELATED APPLICATION

This U.S. non-provisional patent application claims the benefit of priority under 35 U.S.C. § 119 to Korean Patent Application No. 10-2020-0001579, filed on Jan. 6, 2020, in the Korean Intellectual Property Office, the disclosure of which is incorporated by reference in its entirety herein.

BACKGROUND

1. Technical Field

The inventive concept relates to a semiconductor package and a method of manufacturing the same, and more particularly, to a semiconductor package that is resistant to warpage and capable of preventing poor terminal contact and a method of manufacturing the same.

2. Discussion of Related Art

A non-conductive film (NCF) is frequently used as an underfill in a semiconductor package. A semiconductor package may be a metal, plastic, glass, or ceramic casing containing one or more discrete semiconductor devices or integrated circuits. However, as a size and thickness of the semiconductor devices are reduced, a terminal of one of the semiconductor devices may fail to properly contact a terminal of another one of the semiconductor devices or a warpage of one or more of the semiconductor devices may occur.

SUMMARY

At least one embodiment of the inventive concept relates to a semiconductor package including a semiconductor device having a terminal that is less likely to make poor contact with another terminal and that resists warpage.

At least one embodiment, of the inventive concept relates to a method of manufacturing a semiconductor package including a semiconductor device having a terminal that is less likely to make poor contact with another terminal and that resists warpage.

According to an exemplary embodiment of the inventive concept, there is provided a semiconductor package including a substrate, a plurality of semiconductor devices stacked on the substrate, a plurality of underfill fillets (e.g., non-conductive films) disposed between the plurality of semiconductor devices and between the substrate and the plurality of semiconductor devices, and a molding resin surrounding the plurality of semiconductor devices. At least one of the underfill fillets is exposed from side surfaces of the molding resin.

According to an exemplary embodiment of the inventive concept, there is provided a semiconductor package including a package substrate, an interposer substrate stacked on the package substrate, a first sub-package and a second sub-package laterally arranged on the interposer substrate, and a first molding resin surrounding side surfaces of the first sub-package and the second sub-package. The first sub-package includes a first sub-package substrate, a plurality of memory devices stacked on the first sub-package substrate, and a plurality of underfill fillets disposed between the plurality of memory devices and between the first sub-package substrate and the plurality of memory devices. At least one of the underfill fillets horizontally protrudes from side surfaces of the plurality of memory devices by about 200 μm to about 500 μm.

According to an exemplary embodiment of the inventive concept, there is provided a semiconductor package including a package substrate, a plurality of semiconductor devices stacked on the package substrate, a plurality of underfill fillets disposed between the plurality of semiconductor devices and between the package substrate and the plurality of semiconductor devices, and a molding resin surrounding the plurality of semiconductor devices. Each of the underfill fillets protrudes to an outside of side surfaces of the plurality of semiconductor devices. At least one of the underfill fillets is exposed from side surfaces of the molding resin and side surfaces of the underfill fillet exposed from the side surfaces of the molding resin among the underfill fillets are coplanar with the side surfaces of the molding resin. A distance between side surfaces of the plurality of semiconductor devices and side surfaces of the molding resin is no more than 500 μm.

According to an exemplary embodiment the inventive concept, there is provided a method of manufacturing a semiconductor package, including mounting a first non-conductive film (NCF) and a first semiconductor chip on a package substrate under a first mounting condition and mounting a second NCF and a second semiconductor chip on the first semiconductor chip under a second mounting condition. The first mounting condition and the second mounting condition are a temperature, pressure, and pressing time determined to minimize warpage of the semiconductor package. For example, one of the mounting conditions could be designed to fluidize one of the NCFs so that it is wider than the other NCF. For example, one of the mounting conditions could be designed to fluidize one of the NCFs so it becomes exposed from side surfaces of a molding resin surrounding the semiconductor chips and the other NCF remains within the molding resin.

According to an exemplary embodiment of the inventive concept, there is provided a method of manufacturing a semiconductor package, including arranging and mounting a plurality of first non-conductive films (NCF) and a plurality of first semiconductor devices corresponding to the plurality of first NCFs on a substrate under a first mounting condition, mounting a plurality of second NCFs and a plurality of second semiconductor devices on corresponding ones of the plurality of first semiconductor devices under a second mounting condition, forming a molding resin surrounding side surfaces of the plurality of first semiconductor devices and the plurality of second semiconductor devices, and performing singulation to obtain an individual semiconductor package. At least one of NCFs among the first NCFs and the second NCFs contact each other after neighboring NCFs are mounted.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Figure 1A:
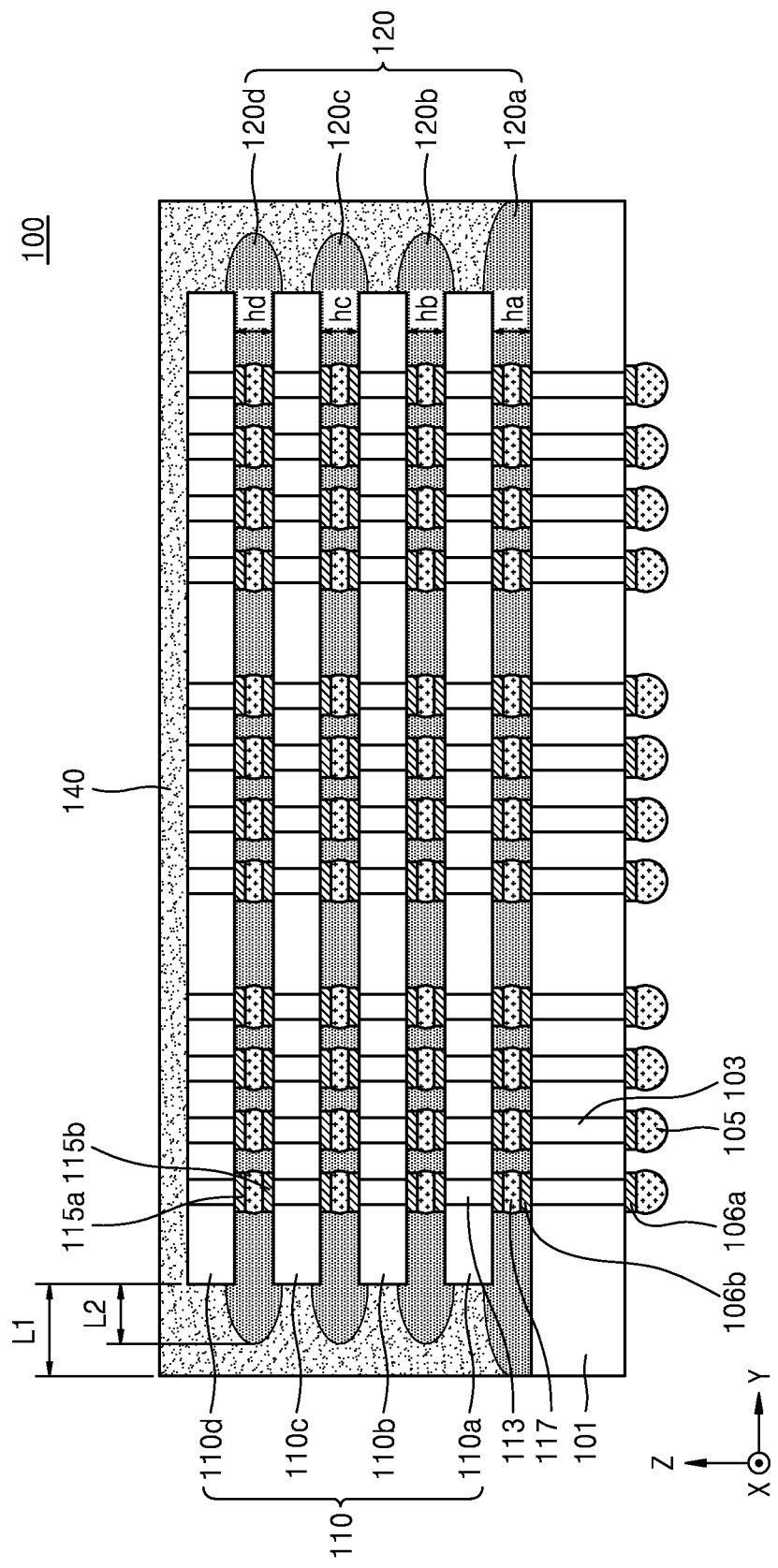
FIG. 1A is a side cross-sectional view of a semiconductor package according to an exemplary embodiment of the inventive concept and FIG. 1B is a side view of the semiconductor package of FIG. 1A observable from a side.

Hereinafter, exemplary embodiments of the inventive concept will be described in detail with reference to the accompanying drawings. Like reference numerals refer to like elements throughout and previously given description will be omitted.

That a semiconductor package is in the form of "cry" represents a type of warpage in which the center of the semiconductor package is raised compared to the edges and that a semiconductor package is in the form of "smile" represents a type of warpage in which the edges of the semiconductor package rise compared to the center.

Figure 1B:
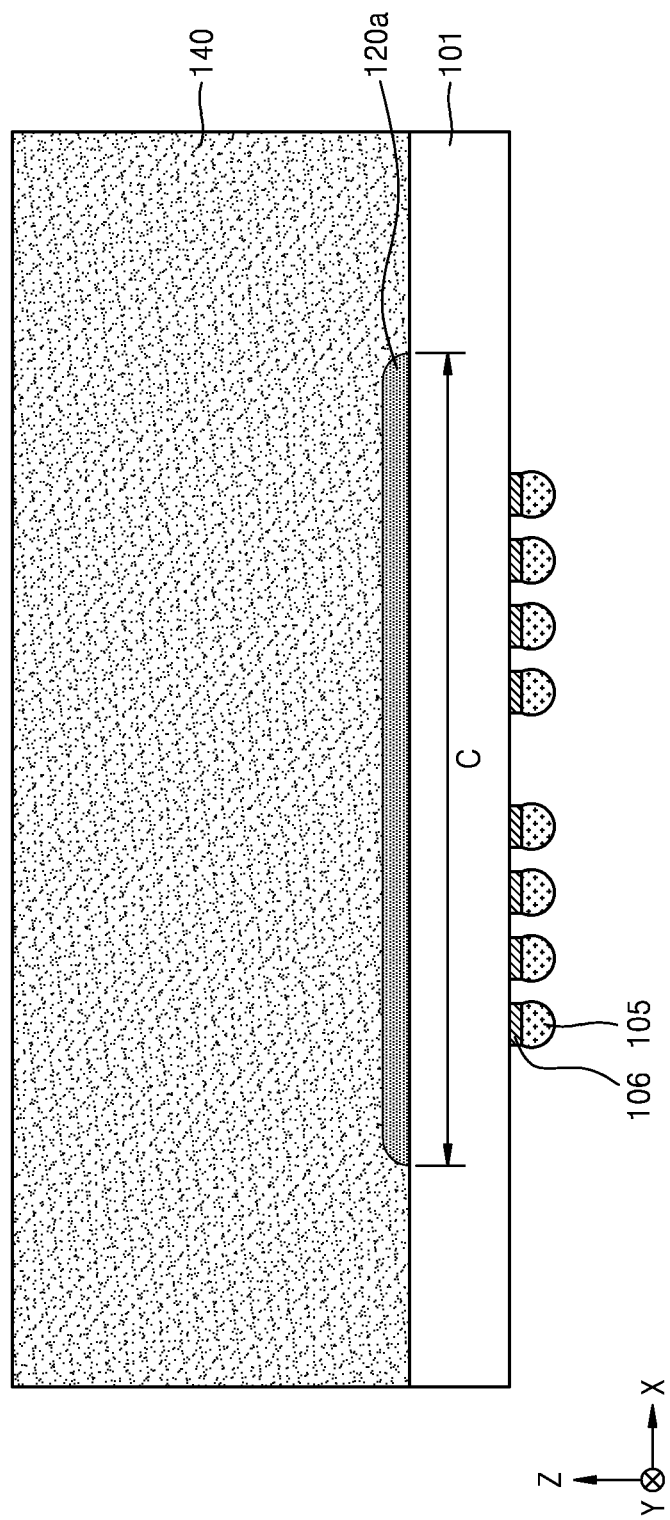

FIG. 1A is a side cross-sectional view of a semiconductor package 100 according to an exemplary embodiment of the inventive concept. FIG. 1B is a side view of the semiconductor package 100 observable from the side.

Referring to FIGS. 1A and 1B, the semiconductor package 100 includes a plurality of semiconductor devices 110 stacked on a substrate 101.

In some embodiments, the substrate 101 may be a printed circuit board (PCB). In this case, the substrate 101 may include a base substrate and upper pads 106b and lower pads 106a respectively formed on an upper surface and a lower surface of the base substrate. The upper pads 106b and lower pads 106a may be exposed by a solder resist layer (not shown) covering the upper surface and lower surface of the base substrate. For example, a solder resist layer may be formed over the lower pads 106a and portions of the solder resist layer may be removed to expose upper surfaces of the lower pads 106a.

The base substrate may include at least one material selected from phenol resin, epoxy resin, and polyimide. For example, the base substrate may include at least one material selected from FR4, tetrafunctional epoxy, polyphenylene ether, epoxy/polyphenylene oxide, BT (bismaleimide triazine), Thermount, cyanate ester, polyimide, and liquid crystal polymer.

The upper pads 106b and lower pads 106a may include copper (Cu), aluminum (Al), nickel (Ni), stainless steel, or beryllium copper (BeCu). An internal wiring line (not shown) electrically connecting the upper pads 106b to the lower pads 106a may be formed in the base substrate. The upper pads 106b and lower pads 106a may be portions exposed by the solder resist layer of a circuit wiring line obtained by forming a Cu foil on the upper surface and the lower surface of the base substrate and patterning the Cu foil.

In some embodiments, the substrate 101 may be an interposer (e.g., an interposer substrate). In this case, the substrate 101 may include the base substrate formed of a semiconductor material and the upper pads 106b and the lower pads 106a respectively formed on the upper surface and the lower surface of the base substrate. The base substrate may be formed of, for example, a silicon wafer. In addition, the internal wiring line (not shown) may be formed in the upper surface, the lower surface, or the inside of the base substrate. In addition, through vias 103 electrically connecting the upper pads 106b to the lower pads 106a may be formed in the base substrate.

External connection terminals 105 may be attached onto the lower surface of the substrate 101. The external connection terminals 105 may be attached onto, for example, the lower pads 106a. The external connection terminals 105 may be, for example, solder balls or bumps. The external connection terminals 105 may electrically connect the semiconductor package 100 to an external device. For example, the external connection terminals 105 may be made of a conductive material.

The plurality of semiconductor devices 110 may be mounted on the substrate 101. The plurality of semiconductor devices 110 may include a first semiconductor device 110a, a second semiconductor device 110b, a third semiconductor device 110c, and a fourth semiconductor device 110d that are sequentially stacked on the substrate 101.

The first to fourth semiconductor devices 110a, 110b, 110c, and 110d may have various semiconductor elements on an active surface of a semiconductor substrate. In some embodiments, the semiconductor substrate of the first to fourth semiconductor devices 110a, 110b, 110c, and 110d may include silicon (Si). In other embodiments, the semiconductor substrate of the first to fourth semiconductor devices 110a, 110b, 110c, and 110d may include a semiconductor atom such as germanium (Ge) or a compound semiconductor such as silicon carbide (SiC), gallium arsenide (GaAs), indium arsenide (InAs), or indium phosphide (InP). In some embodiments, the semiconductor substrate of the first to fourth semiconductor devices 110a, 110b, 110c, and 110d may have a silicon-on-insulator (SOI) structure. For example, the semiconductor substrate may include a buried oxide (BOX) layer. In some embodiments, the semiconductor substrate of the first to fourth semiconductor devices 110a, 110b, 110c, and 110d may include a conductive region, for example, a well doped with impurities. In some embodiments, the semiconductor substrate of the first to fourth semiconductor devices 110a, 110b, 110c, and 110d may have various device isolation structures such as a shallow trench isolation (STI) structure.

In the first to fourth semiconductor devices 110a, 110b, 110c, and 110d, semiconductor devices including a plurality of various kinds of individual devices may be formed. The plurality of various kinds of individual devices may include various microelectronic devices, for example, a metal-oxide-semiconductor field effect transistor (MOSFET) such as a complementary metal-insulator-semiconductor (CMOS) transistor, a large scale integration (LSI) circuit such as an image sensor. For example, the image sensor may be a CMOS image sensor (CIS), a micro-electro-mechanical system (MEMS), an active device, or a passive device.

In some embodiments, the plurality of individual devices may be electrically connected to the conductive region of the semiconductor substrate of the first to fourth semiconductor devices 110a, 110b, 110c, and 110d. The semiconductor device may further include a conductive wiring line or a conductive plug electrically connecting at least two of the plurality of individual devices or the plurality of individual devices to the conductive region of the semiconductor substrate of the first to fourth semiconductor devices 110a, 110b, 110c, and 110d. In addition, each of the plurality of individual devices may be electrically isolated by an insulating layer from each of other adjacent individual devices.

Each of the first to fourth semiconductor devices 110a, 110b, 110c, and 110d may be, for example, a memory semiconductor chip. The memory semiconductor chip may be, for example, a volatile memory semiconductor chip such as dynamic random access memory (DRAM) or static random access memory (SRAM) or a non-volatile memory semiconductor chip such as phase-change random access memory (PRAM), magnetoresistive random access memory (MRAM), ferroelectric random access memory (FeRAM), or resistive random access memory (RRAM).

At least one of the plurality of semiconductor devices 110 may be a logic semiconductor chip and the remaining ones may be memory semiconductor chips. For example, the lowermost first semiconductor device 110a of the plurality of semiconductor devices 110 may be the logic semiconductor chip and the remaining second to fourth semiconductor devices 110b, 110c, and 110d may be the memory semiconductor chips. For example, the lowermost first semiconductor device 110a of the plurality of semiconductor devices 110 may be a controller chip (e.g., including a memory controller) for controlling the remaining second to fourth semiconductor devices 110b, 110c, and 110d and the remaining second to fourth semiconductor devices 110b, 110c, and 110d may be high bandwidth memory (HBM) DRAM semiconductor chips.

In FIGS. 1A and 1B, it is illustrated that four semiconductor devices are stacked on the substrate 101. However, embodiments of the inventive concept are not limited thereto as the number of semiconductor devices stacked on the substrate 101 may be 2, 3, 5, or more. When all of the plurality of semiconductor devices 110 are memory semiconductor devices, the number of semiconductor devices 110 may be a multiple of 2. When the plurality of semiconductor devices 110 include one or more logic semiconductor devices and the remaining semiconductor devices are memory semiconductor devices, the number of memory semiconductor devices included in the plurality of semiconductor devices 110 may be a multiple of 2. In some embodiments, the memory semiconductor devices included in the plurality of semiconductor devices 110 may be the same kind of memory semiconductor devices.

The first to fourth semiconductor devices 110a, 110b, 110c, and 110d included in the plurality of semiconductor devices 110 may include a plurality of through electrodes 113. The plurality of through electrodes 113 may be arranged in a matrix, for example, with a pitch of tens of μm. Each of the plurality of through electrodes 113 may have a diameter of, for example, several μm to several tens of μm.

In some embodiments, each of the plurality of through electrodes 113 may have a diameter of about 5 μm to about 15 μm and may be arranged with a pitch of about 25 μm to about 50 μm. For example, the electrodes 113 in a given one of the semiconductor devices 110 stacked in a Z direction may be spaced 30 μm apart from one another in a Y direction.

The first to fourth semiconductor devices 110a, 110b, 110c, and 110d included in the plurality of semiconductor devices 110 may be electrically connected to each other by the plurality of corresponding through electrodes 113. The first to fourth semiconductor devices 110a, 110b, 110c, and 110d included in the plurality of semiconductor devices 110 may be electrically connected to the substrate 101 by the plurality of through electrodes 113. The plurality of through electrodes 113 may provide at least one of a signal, power source, or ground for the plurality of semiconductor devices 110.

Connection terminals 117 connected to the plurality of through electrodes 113 may be attached to lower surfaces of the first to fourth semiconductor devices 110a, 110b, 110c, and 110d included in the plurality of semiconductor devices 110. Each of the connection terminals 117 may have a diameter of, for example, tens of μm. In an exemplary embodiment of the inventive concept, the diameter of each of the connection terminals 117 is greater than the diameter of each of the plurality of through electrodes 113 and less than the pitch with which the plurality of through electrodes 113 are arranged. For example, each of the connection terminals 117 may have a diameter of about 20 μm.

Each of the plurality of through electrodes 113 may be formed of through silicon via (TSV). Each of the plurality of through electrodes 113 may include a wiring metal layer and a barrier metal layer surrounding the wiring metal layer.

The wiring metal layer may include Cu or tungsten (W). For example, the wiring metal layer may be formed of Cu, CuSn, CuMg, CuNi, CuZn, CuPd, CuAu, CuRe, CuW, W, or a W alloy. However, the inventive concept is not limited thereto. For example, the wiring metal layer may include one or more of Al, Au, Be, Bi, Co, Cu, Hf, In, Mn, Mo, Ni, Pb, Pd, Pt, Rh, Re, Ru, Ta, Te, Ti, W, Zn, and Zr and a stack structure of two or more of Al, Au, Be, Bi, Co, Cu, Hf, In, Mn, Mo, Ni, Pb, Pd, Pt, Rh, Re, Ru, Ta, Te, Ti, W, Zn, and Zr.

The barrier metal layer may include at least one material selected from W, WN, WC, Ti, TiN, Ta, TaN, Ru, Co, Mn, WN, Ni, and NiB and may be formed of a single layer or a multilayer.

However, a material of each of the plurality of through electrodes 113 is not limited thereto. The barrier metal layer and the wiring metal layer may be formed by a physical vapor deposition (PVD) process or a chemical vapor deposition (CVD) process. However, the inventive concept is not limited thereto. In some embodiments, a spacer insulating layer may be interposed between the plurality of through electrodes 113 and the semiconductor substrate including the plurality of semiconductor devices 110. The spacer insulating layer may prevent the semiconductor devices formed in the first to fourth semiconductor devices 110a, 110b, 110c, and 110d included in the plurality of semiconductor devices 110 from directly contacting the plurality of through electrodes 113. The spacer insulating layer may be formed of an oxide layer, a nitride layer, a carbide layer, polymer, or a combination of the above materials. In some embodiments, the CVD process may be used to form the spacer insulating layer. The spacer insulating layer may be formed of an ozone/tetra-ethyl ortho-silicate ($O_3$/TEOS) based high aspect ratio process (HARP) oxide layer formed by a sub-atmospheric CVD process.

In an exemplary embodiment of the inventive concept, the plurality of through electrodes 113 directly connect active surfaces and non-active surfaces of the first to fourth semiconductor devices 110a, 110b, 110c, and 110d included in the plurality of semiconductor devices 110 to each other. However, the inventive concept is not limited thereto. The plurality of through electrodes 113 may be formed in any one of a via-first structure, a via-middle structure, and a via-last structure. Since a method of manufacturing the via-first structure, the via-middle structure, or the via-last structure is disclosed in a plurality of documents such as Three Dimensional System Integration published by Springer in 2011, 3D Integration for VLSI Systems published by CRC Press in 2012, and Designing TSVs for 3D Integrated Circuits published by Springer in 2013, detailed description thereof is omitted.

The lower pads 115a and the upper pads 115b electrically connected to the through electrodes 113 may be provided on the lower surfaces and upper surfaces of the first to fourth semiconductor devices 110a, 110b, 110c, 110d included in the plurality of semiconductor devices 110. The lower pads 115a and the upper pads 115b may be formed in positions corresponding to the through electrodes 113 and may be electrically connected to the plurality of through electrodes 113. However, the inventive concept is not limited thereto. For example, the lower pads 115a and the upper pads 115b may be formed in positions apart from the through electrodes 113 and may be electrically connected to the through electrodes 113 via a redistribution layer. The lower pads 115a and the upper pads 115b may be defined by standard protocol such as JEDEC standards and each of the lower pads 115a and the upper pads 115b may have a thickness of hundreds of nm to several μm. In addition, the lower pads 115a and the upper pads 115b may include at least one of Al, Cu, Ta, Ti, W, Ni, and Au.

A first molding resin 140 surrounding side surfaces of the plurality of semiconductor devices 110 may be provided on the substrate 101. The first molding resin 140 may be formed of, for example, an epoxy molding compound (EMC). In some embodiments, the first molding resin 140 may be provided to cover an upper surface of the uppermost semiconductor device (here, the fourth semiconductor device 110d) among the plurality of semiconductor devices 110. In other embodiments, the first molding resin 140 may expose the upper surface of the uppermost semiconductor device (here, the fourth semiconductor device 110d) among the plurality of semiconductor devices 110. For example, a portion of the first molding resin 140 may be removed to expose the upper surface of the fourth semiconductor device 110d.

An underfill fillet 120 (e.g., an underfill layer) may be provided among the plurality of semiconductor devices 110 and between the substrate 101 and the plurality of semiconductor devices 110. For example, an underfill layer may be located between the substrate 101 and a bottom one of the semiconductor devices 110, and an underfill layer may be located between each pair of the semiconductor devices 110.

The underfill fillet 120 may fill spaces between the first semiconductor device 110a and the substrate 101. In addition, the underfill fillet 120 may fill spaces between the second to fourth semiconductor devices 110b, 110c, and 110d. The underfill fillet 120 may increase adhesive strength of components and/or prevent a decrease in physical strength due to deformation of the components. In some embodiments, the underfill fillet 120 is provided in the spaces to remove an empty space into which foreign material or moisture may permeate and/or to prevent electrical migration.

The underfill fillet 120 may protrude to the outsides of the side surfaces of the first to fourth semiconductor devices 110a, 110b, 110c, and 110d while filling spaces between the package substrate 101 and the first to fourth semiconductor devices 110a, 110b, 110c, and 110d. In an exemplary embodiment of the inventive concept, a first underfill fillet 120a is disposed in a space between the substrate 101 and the first semiconductor device 110a and protrudes to the outside from side surfaces of the first semiconductor device 110a. In an exemplary embodiment of the inventive concept, a second underfill fillet 120b is disposed in a space between the first semiconductor device 110a and the second semiconductor device 110b and protrude to the outside from side surfaces of the second semiconductor device 110b. In an exemplary embodiment of the inventive concept, a third underfill fillet 120c is disposed in a space between the second semiconductor device 110b and the third semiconductor device 110c and protrudes to the outside from side surfaces of the third semiconductor device 110c. In an exemplary embodiment of the inventive concept, a fourth underfill fillet 120d is disposed in a space between the third semiconductor device 110c and the fourth semiconductor device 110d and protrudes to the outside from side surfaces of the fourth semiconductor device 110d.

In some embodiments, the first to fourth underfill fillets 120a to 120d do not contact each other and are separated from each other. In some embodiments, two adjacent underfill fillets of the first to fourth underfill fillets 120a to 120d may contact each other with an interface interposed therebetween. For example, an upper surface of the interface may contact one of two adjacent underfill fillets and a lower surface of the interface may contact the other of the two adjacent underfill fillets.

Figure 2:
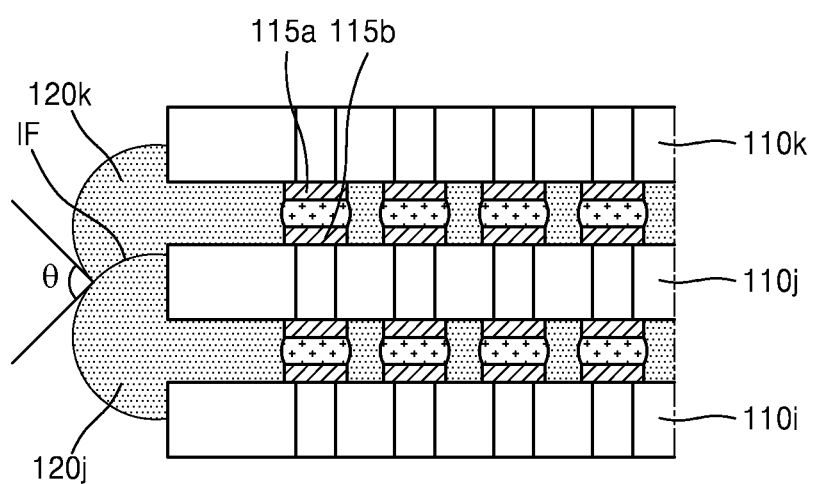
FIG. 2 is a partial side cross-sectional view illustrating two adjacent underfill fillets according to an exemplary embodiment of the inventive concept.

FIG. 2 is a partial side cross-sectional view illustrating that two adjacent underfill fillets according to an exemplary embodiment of the inventive concept.

Referring to FIG. 2, two adjacent underfill fillets 120j and 120k among three semiconductor devices 110i, 110j, and 110k are provided. The two underfill fillets 120j and 120k protrude to the outside from side surfaces of the semiconductor devices 110i, 110j, and 110k. The two underfill fillets 120j and 120k swell up and down as well as in a lateral direction when protruding to the outside from the side surfaces of the semiconductor devices 110i, 110j, and 110k.

In detail, the j-th underfill fillet 120j and the j-th semiconductor device 110j are arranged on the i-th semiconductor device 110i and the j-th underfill fillet 120j is heated and pressed so that the j-th underfill fillet 120j protrudes to the outside from the side surface of the j-th semiconductor device 110j and is cured. For example, physical pressure may be applied to the j-th underfill fillet 120j to cause the j-th underfill fillet 120j to be pressed.

Then, the k-th underfill fillet 120k and the k-th semiconductor device 110k are arranged on the j-th semiconductor device 110j and the k-th underfill fillet 120k is heated and pressed so that the k-th underfill fillet 120k protrudes to the outside from the side surface of the k-th semiconductor device 110k. Since the k-th underfill fillet 120k is heated and pressed, the k-th underfill fillet 120k swells up and down while protruding to the side surface of the k-th semiconductor device 110k. When swelling occurs more than a certain level, the k-th underfill fillet 120k contacts the j-th underfill fillet 120j that is previously formed. At this time, since the j-th underfill fillet 120j is previously cured, an interface IF may be formed between the j-th underfill fillet 120j and the k-th underfill fillet 120k.

In addition, the k-th underfill fillet 120k does not contact with the j-th underfill fillet 120j while j-th underfill fillet 120j has fluidity. Instead, after the j-th underfill fillet 120j is cured, the k-th underfill fillet 120k is reflowed and contacts the cured j-th underfill fillet 120. Therefore, at a contact point, a surface of the j-th underfill fillet 120j and a surface of the k-th underfill fillet 120k may contact each other at a predetermined angle θ. The angle θ is formed by tangential lines at the contact point, which may be an acute angle, a right angle, or an obtuse angle. However, the inventive concept is not limited thereto.

Referring back to FIGS. 1A and 1B, the underfill fillet 120 may be, for example, bisphenol A (BPA) epoxy resin, bisphenol F (BPF) epoxy resin, aliphatic epoxy resin, or cycloaliphatic epoxy resin and may further include powder such as silica, alumina, zirconia, titania (e.g., titanium dioxide), ceria, magnesia, silicon carbide, or aluminum nitride as an inorganic filler.

In some embodiments, the first to fourth underfill fillets 120a, 120b, 120c, and 120d included in the underfill fillet 120 may be the same kind of underfill fillets. In other embodiments, at least two of the first to fourth underfill fillets 120a, 120b, 120c, and 120d may have different contents and kinds of inorganic fillers, different kinds of resin, and/or resin with different physical properties.

At least one of the first to fourth underfill fillets 120a, 120b, 120c, and 120d may protrude more to the outside than the other underfill fillet(s). As illustrated in FIG. 1A, the first underfill fillet 120a may protrude to the outside by L1 and the second to fourth underfill fillets 120b, 120c, and 120d may protrude to the outside by L2. In an exemplary embodiment, L1 is greater than L2. In some embodiments, L1 may be no more than about 500 μm. In some embodiments, L1 may be about 30 μm to about 450 μm, about 60 μm to about 400 μm, about 100 μm to about 350 μm, or about 120 μm to about 300 μm.

When L1 is too large, an area occupied by the semiconductor package 100 may be excessively large. When L1 is too small, tolerance is so small that it may be difficult to manufacture the semiconductor package 100.

The underfill fillets protruding more to the outside than the other underfill fillet(s) among the underfill fillets 120 may be exposed to the outside from side surfaces of the molding resin 140. As illustrated in FIG. 1A, the first underfill fillet 120a may protrude more to the outside than the other underfill fillets and extend up to the side surfaces of the molding resin 140. In FIG. 1A, it is illustrated that the first underfill fillet 120a protrudes most to the outside. However, those skilled in the art may understand that another underfill fillet 120 may protrude most to the outside to be exposed to the side surfaces of the molding resin 140.

In some embodiments, at least one of the first to fourth underfill fillets 120a, 120b, 120c, and 120d is not exposed from the side surfaces of the molding resin 140. In some embodiments, at least two of the first to fourth underfill fillets 120a, 120b, 120c, and 120d may be exposed from the side surfaces of the molding resin 140. In some embodiments, the first underfill fillet 120a may be exposed from the side surfaces of the molding resin 140 and at least one of the second to fourth underfill fillets 120b, 120c, and 120d may be exposed from the side surfaces of the molding resin 140.

In an exemplary embodiment of the inventive concept, the underfill fillet extending to the side surfaces of the molding resin 140 and exposed from the side surfaces of the molding resin 140 (here, the first underfill fillet 120a) directly contacts the substrate 101. As illustrated in FIG. 1B, the exposed first underfill fillet 120a may contact the substrate 101 at the side surfaces of the molding resin 140 along a length C.

In other embodiments, the exposed underfill fillet does not contact the substrate 101 at the side surfaces of the molding resin 140.

The substrate 101 and the first semiconductor device 110a may be spaced apart from each other by a first distance ha. The first semiconductor device 110a and the second semiconductor device 110b may be apart from each other by a second distance hb. The second semiconductor device 110b and the third semiconductor device 110c may be apart from each other by a third distance hc. The third semiconductor device 110c and the fourth semiconductor device 110d may be apart from each other by a fourth distance hd.

In an exemplary embodiment, the first to fourth distances ha to hd differ from one another. In an exemplary embodiment, an underfill fillet protruding more from the side surfaces of the plurality of semiconductor devices 110 to the outside has a smaller distance than another one of the semiconductor devices 110 that protrudes less from the sides surface. In some embodiments, as illustrated in FIG. 1A, the first underfill fillet 120a horizontally protrudes more than the other underfill fillets and the first distance ha is less than the other distances (the second distance hb, the third distance hc, and the fourth distance hd).

As described above, at least two of the first to fourth underfill fillets 120a, 120b, 120c, and 120d may have different contents and kinds of inorganic fillers, different kinds of resin, and/or resin with different physical properties.

In accordance with contents and kinds of inorganic fillers and kinds and physical properties of resin, the first to fourth underfill fillets 120a, 120b, 120c, and 120d may have, for example, different coefficients of thermal expansion (CTE), viscosities, and glass transition temperatures (Tg).

In some embodiments, by controlling the CTEs of the first to fourth underfill fillets 120a, 120b, 120c, and 120d, warpage of the semiconductor package 100 may be controlled. Warpage of the semiconductor package 100 may be controlled by controlling degrees to which the underfill fillets 120 (here, the first to fourth underfill fillets 120a, 120b, 120c, and 120d) horizontally extend. That is, at least two of the first to fourth underfill fillets 120a, 120b, 120c, and 120d may have different physical properties and lengths with which the first to fourth underfill fillets 120a, 120b, 120c, and 120d horizontally extend and protrude may be different from each other. In this case, a physical property of an underfill fillet horizontally extending and protruding with a greater length affects the warpage of the semiconductor package 100 more than a physical property of an underfill fillet horizontally extending and protruding with a less length.

In the embodiment illustrated in FIG. 1A, since a length with which the first underfill fillet 120a horizontally extends is greater than lengths with which the second to fourth underfill fillets 120b, 120c, and 120d horizontally extend, the first underfill fillet 120a affects the warpage of the semiconductor package 100 more than the second to fourth underfill fillets 120b, 120c, and 120d.

For example, when the length with which the first underfill fillet 120a protrudes is the same as the length with which the second underfill fillet 120b protrudes as L2, the semiconductor package 100 may be bent in the form of a smile. At this time, it is assumed that the first underfill fillet 120a has a CTE greater than that of the second underfill fillet 120b. In such a case, by simply having the first underfill fillet 120a horizontally protrude with a length greater than L2, horizontal contraction of the first underfill fillet 120a may be reflected more. As a result, a degree to which the semiconductor package 100 is bent in the form of smile may be reduced or warpage may be prevented. That is, a degree of the warpage of the semiconductor package 100 may be controlled by increasing the length with which the first underfill fillet 120a horizontally extends without another change. This is because an effect of the first underfill fillet 120a with the greater CTE increases.

In FIG. 1A, it is illustrated that the degree to which the first underfill fillet 120a protrudes is greatest. However, another underfill fillet, for example, the second underfill fillet 120b, the third underfill fillet 120c, or the fourth underfill fillet 120d may horizontally protrude most. As described above, by increasing the degree to which the second underfill fillet 120b, the third underfill fillet 120c, or the fourth underfill fillet 120d horizontally protrudes, the physical property of a certain underfill fillet may be rendered to contribute more to the warpage of the semiconductor package 100.

In addition, in manufacturing the semiconductor package 100, when the underfill fillet 120 is reflowed (e.g., fluidized) by applying heat and pressure, a portion of the underfill fillet 120 positioned around the center of the semiconductor devices 110 is fluidized toward the outside. At this time, the portion of the underfill fillet 120 fluidized to the outside may be concentrated at external edges of the semiconductor devices 110 so that a normal connection of the semiconductor devices 110 may deteriorate. In an exemplary embodiment, the underfill fillet 120 around the centers of the semiconductor devices 110 and between the centers and the edges of the semiconductor devices 110 is simultaneously reflowed and concentrated around the edges of the semiconductor devices 110. The concentrated underfill fillet 120 may lift the edges of the semiconductor devices 110 up. Therefore, connection of the semiconductor devices 110 may deteriorate. In particular, as a thickness of each of the semiconductor devices 110 becomes smaller, the semiconductor devices 110 are affected more by this lifting.

Furthermore, the second to fourth underfill fillets 120b, 120c, and 120d may horizontally protrude more easily than the first underfill fillet 120a positioned under the lowermost semiconductor device (in FIG. 1A, the first semiconductor device 110a). That is, the second to fourth underfill fillets 120b, 120c, and 120d may horizontally move and move up and down while being fluidized out of spaces among the semiconductor devices 110. On the other hand, the first underfill fillet 120a may move only horizontally or upward while being fluidized out of a space between the first semiconductor device 110a and the substrate 101. Therefore, fluidization of the first underfill fillet 120a may be limited in comparison with the second to fourth underfill fillets 120b, 120c, and 120d so that the first underfill fillet 120a may protrude more in a horizontal direction.

Figure 3A:
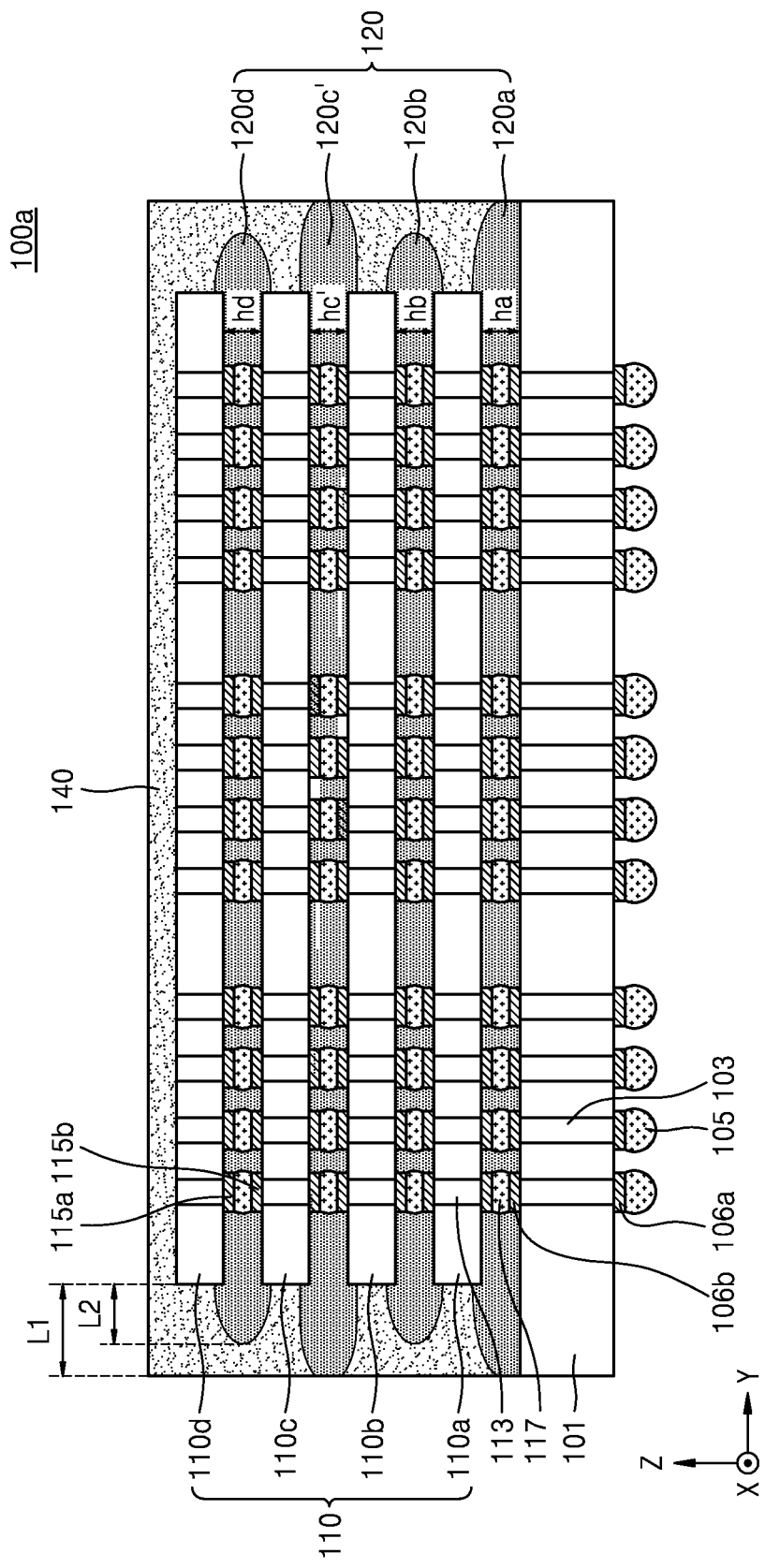
FIG. 3A is a side cross-sectional view of a semiconductor package according to an exemplary embodiment of the inventive concept and FIG. 3B is a side view of a semiconductor package observable from a side.

By having the first underfill fillet 120a horizontally protrude enough, a lifting problem of the semiconductor devices 110 may be solved and limitations on a fluidizing path of the first underfill fillet 120a may be relieved In some embodiments, at least two of the underfill fillets 120 horizontally protrude more than the other underfill fillet(s). In some embodiments, at least two of the underfill fillets 120 are exposed from side surfaces of the molding resin 140 to the outside. FIG. 3A is a side cross-sectional view of a semiconductor package 100a according to an exemplary embodiment of the inventive concept and FIG. 3B is a side view of the semiconductor package 100a observable from a side.

Figure 3B:
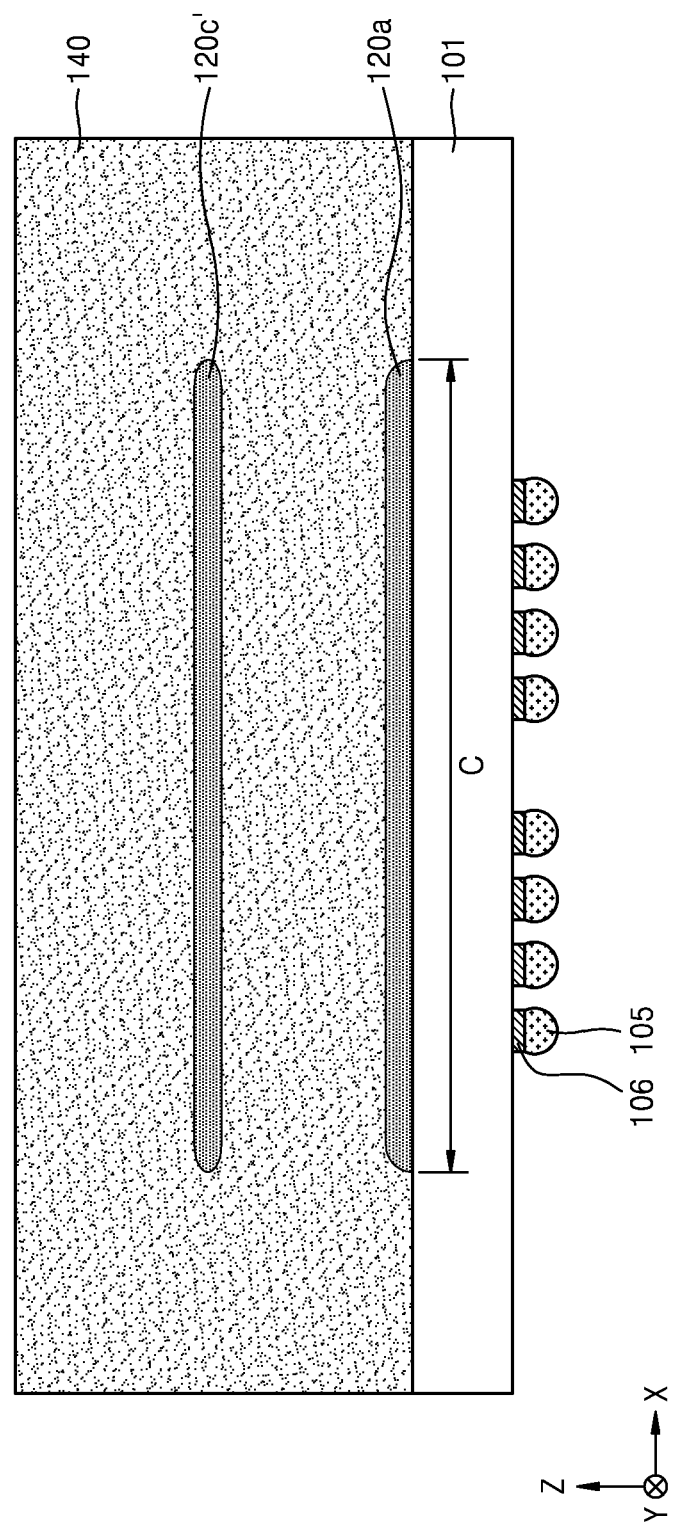

Referring to FIGS. 3A and 3B, the semiconductor package 100a is the same as the semiconductor package 100 described with reference to FIGS. 1A and 1B except that an underfill fillet other than the first underfill fillet 120a, that is, a third underfill fillet 120c' extends to the side surfaces of the molding resin 140 and is exposed from the side surfaces of the molding resin 140. Therefore, hereinafter, such a difference will be mainly described and a previously given description may be omitted.

The third underfill fillet 120c' horizontally extends more than the third underfill fillet 120c of FIG. 1A. In FIG. 3A, it is illustrated that the first to fourth underfill fillets 120a, 120b, 120c', and 120d do not contact each other. However, two of the first to fourth underfill fillets 120a, 120b, 120c', and 120d may contact each other as illustrated in FIG. 2. When the third underfill fillet 120c' of FIG. 3A is obtained by having the third underfill fillet 120c of FIG. 1 horizontally protrude more, a third distance hc' between the second semiconductor device 110b and the third semiconductor device 110c may be smaller than the third distance hc of FIG. 1A.

As described above with reference to FIGS. 1A and 1B, in order to precisely control the warpage of the semiconductor package 100a, lengths with which the second to fourth underfill fillets 120b, 120c', and 120d horizontally extend may also be controlled.

For example, like in the semiconductor package 100 of FIG. 1A, the warpage of the semiconductor package 100a may be controlled by controlling the length with which the first underfill fillet 120a protrudes. Nevertheless, the warpage of the semiconductor package 100a of FIG. 3A may not be sufficiently controlled. At this time, by controlling the length with which the third underfill fillet 120c' protrudes, the warpage of the semiconductor package 100a may be more precisely controlled.

As described above with reference to FIG. 1A, even though the length with which the first underfill fillet 120a protrudes has been increased, the semiconductor package 100a may be bent in the form of a smile. At this time, it is assumed that the third underfill fillet 120c' has a CTE smaller than that of the second underfill fillet 120b and the second underfill fillet 120b has a CTE smaller than that of the first underfill fillet 120a. In this case, by simply having the third underfill fillet 120c' horizontally protrude with a length greater than L2, a characteristic in which the third underfill fillet 120c' horizontally contracts may be reflected more to the semiconductor package 100a. That is, the CTE of the third underfill fillet 120c' is less than the CTE of the first underfill fillet 120a and the characteristic of the third underfill fillet 120c' horizontally contracting less than the first underfill fillet 120a is reflected more to the semiconductor package 100a. As a result, a degree to which the semiconductor package 100a is bent in the form of a smile may be reduced.

In the semiconductor package according to at least one exemplary embodiment of the inventive concept, it is possible to prevent poor contact of a terminal and to minimize the warpage of the semiconductor package.

Figure 4:
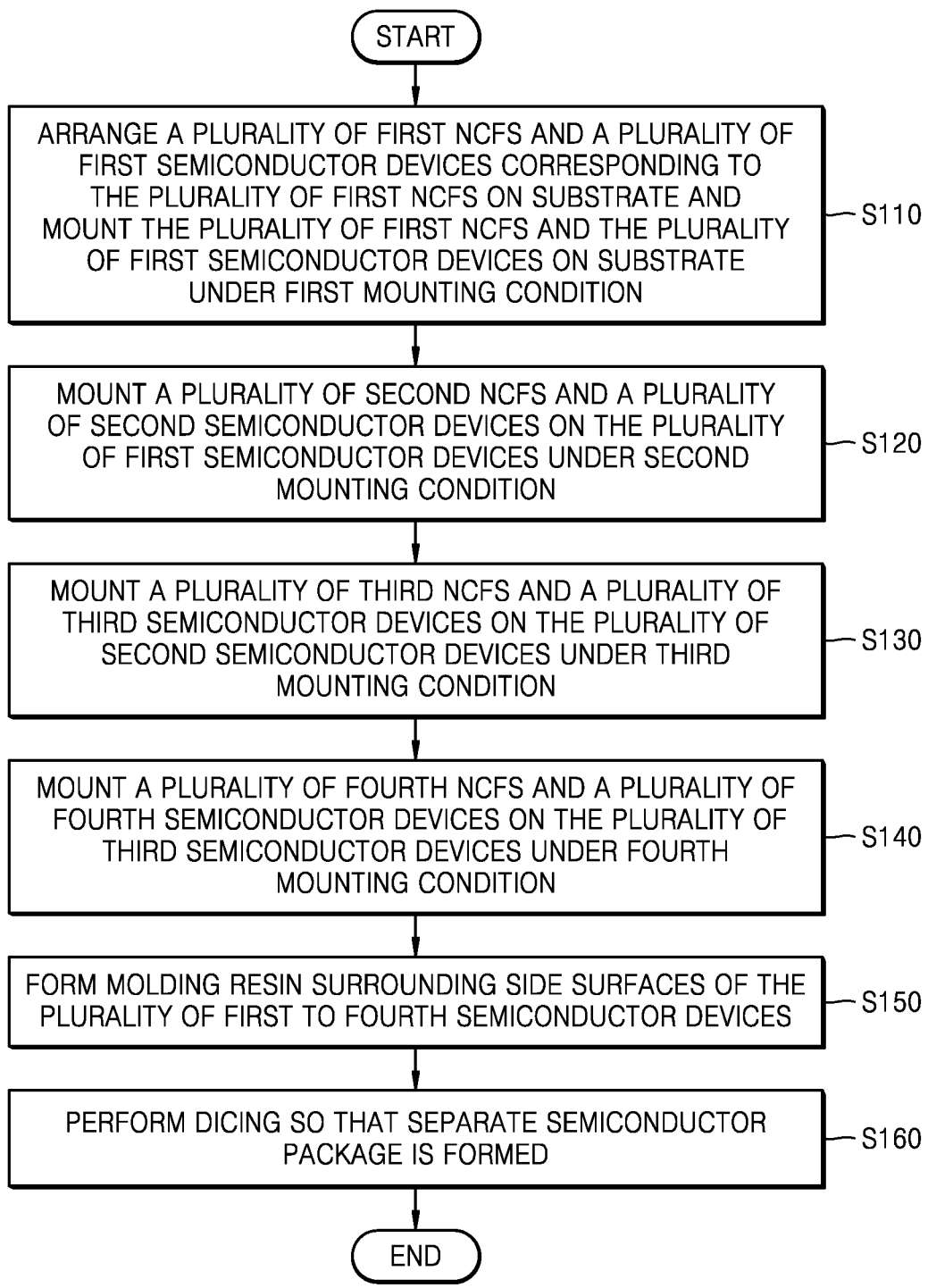
FIG. 4 is a flowchart illustrating a method of manufacturing a semiconductor package according to an exemplary embodiment of the inventive concept.

FIG. 4 is a flowchart illustrating a method of manufacturing a semiconductor package according to an exemplary embodiment of the inventive concept. FIGS. 5A to 5G are side cross-sectional views illustrating a method of manufacturing the semiconductor package according to an exemplary embodiment of the inventive concept.

Figure 5A:
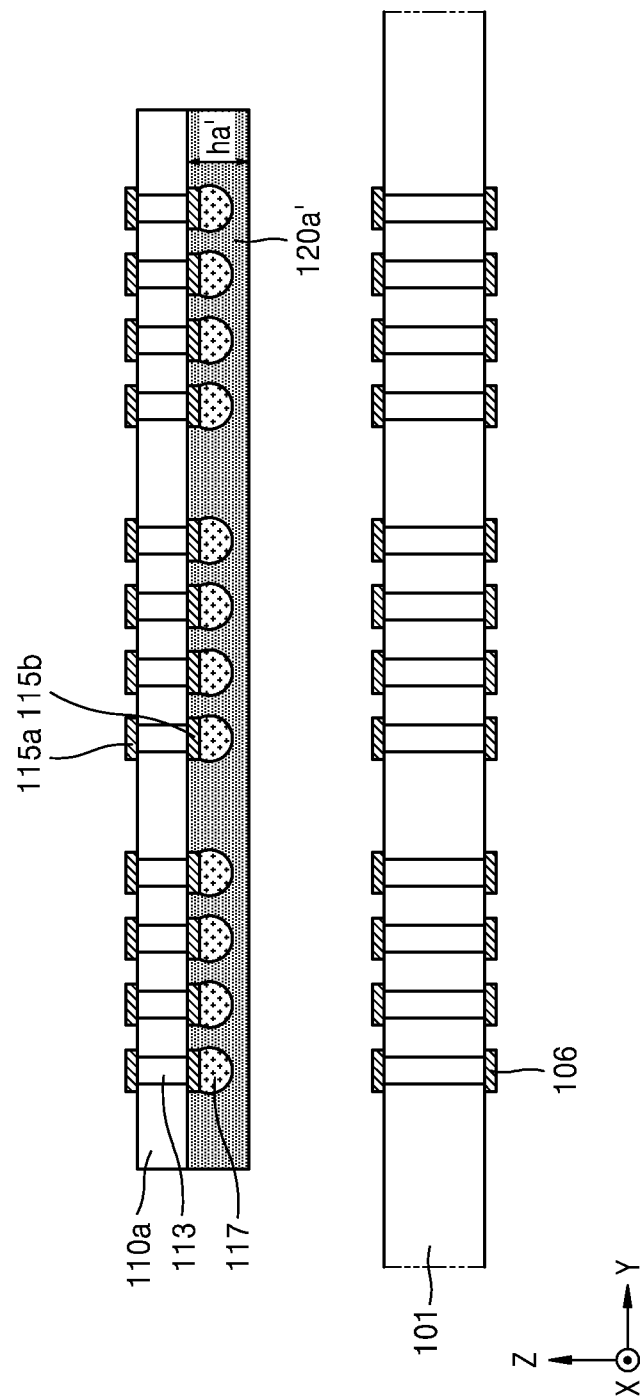
FIGS. 5A to 5G are side cross-sectional views illustrating a method of manufacturing the semiconductor package according to an exemplary embodiment of the inventive concept.

Referring to FIGS. 4 and 5A, a plurality of first semiconductor devices 110a are arranged on a substrate 101 and are mounted on the substrate 101 under a first mounting condition in operation S110.

In FIG. 5A, only one first semiconductor device 110a is illustrated. However, on the substrate 101 extending in X and Y directions, the plurality of semiconductor devices 110a may be arranged and mounted, for example, in a grid configuration.

First non-conductive films (NCF) 120a' may be respectively attached to a corresponding one of the plurality of first semiconductor devices 110a. In an exemplary embodiment, a dimension of the first NCF 120a' in a horizontal direction (a direction of an XY plane) is the same as that of the first semiconductor device 110a. In an exemplary embodiment, a thickness ha' of the first NCF 120a' is greater than a height of each of the connection terminals 117 in a Z direction. In this case, the connection terminals 117 may be surrounded by the first NCF 120a'. However, in other embodiments, lower ends of the connection terminals 117 may be partially exposed from the first NCF 120a'.

Since the substrate 101 and the first semiconductor device 110a are described in detail with reference to FIG. 1A, a detailed description thereof will be omitted.

Figure 5B:
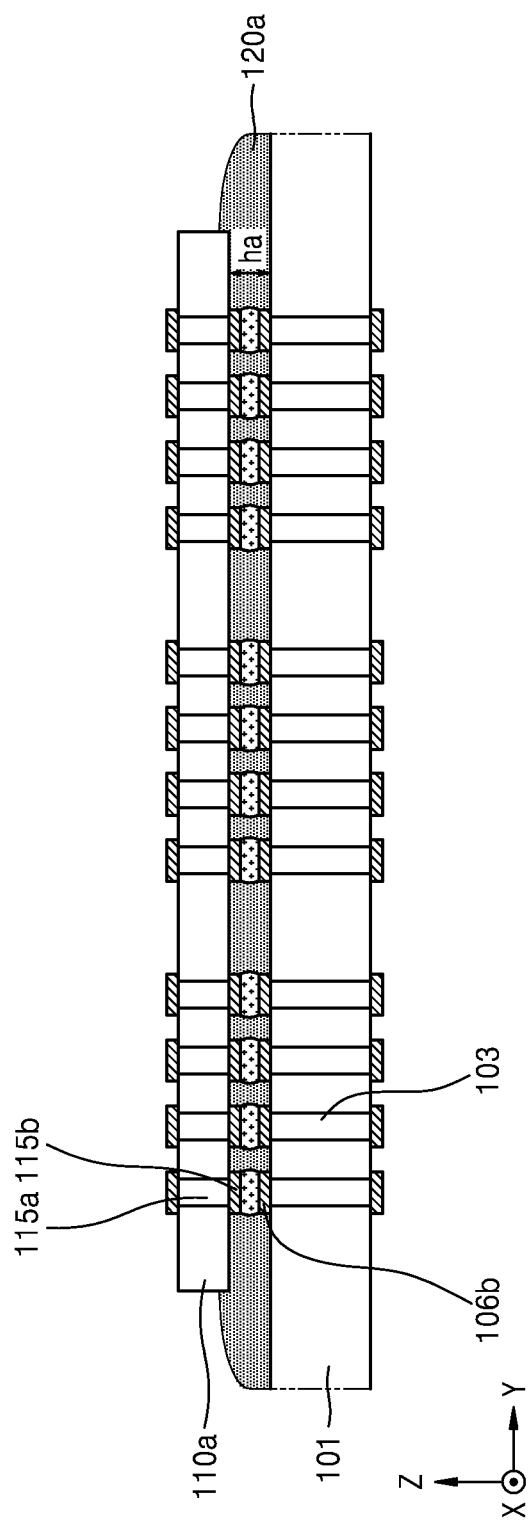

Referring to FIG. 5B, the first semiconductor device 110a is mounted on the substrate 101 under the first mounting condition. The first mounting condition includes a temperature, pressure, and time during which the first semiconductor device 110a is mounted.

In some embodiments, the temperature of the first mounting condition may be about 180° C. to about 280° C. In some embodiments, the pressure of the first mounting condition may be about 5 kPa to about 200 kPa. The time of the first mounting condition may be about 1 second to about 100 seconds. The temperature, pressure, and time are closely correlated and, for example, by increasing a time a little while reducing a pressure a little under a certain mounting condition, the same mounting result may be obtained. In addition, for example, by increasing a temperature a little while reducing a time a little under a certain mounting condition, the same mounting result may be obtained. In addition, for example, by increasing a pressure a little while reducing a temperature a little under a certain mounting condition, the same mounting result may be obtained. A degree to which the first NCF 120a' is fluidized and horizontally protrudes may be controlled by properly controlling the mounting condition such as the temperature, pressure, and time.

By cooling the first NCF 120a' that is fluidized and protrudes, the first underfill fillet 120a may be obtained.

By using the method of manufacturing the semiconductor package according to at least one exemplary embodiment of the inventive concept, it is possible to prevent contact failure of a terminal and to minimize the warpage of the semiconductor package.

Figure 6:
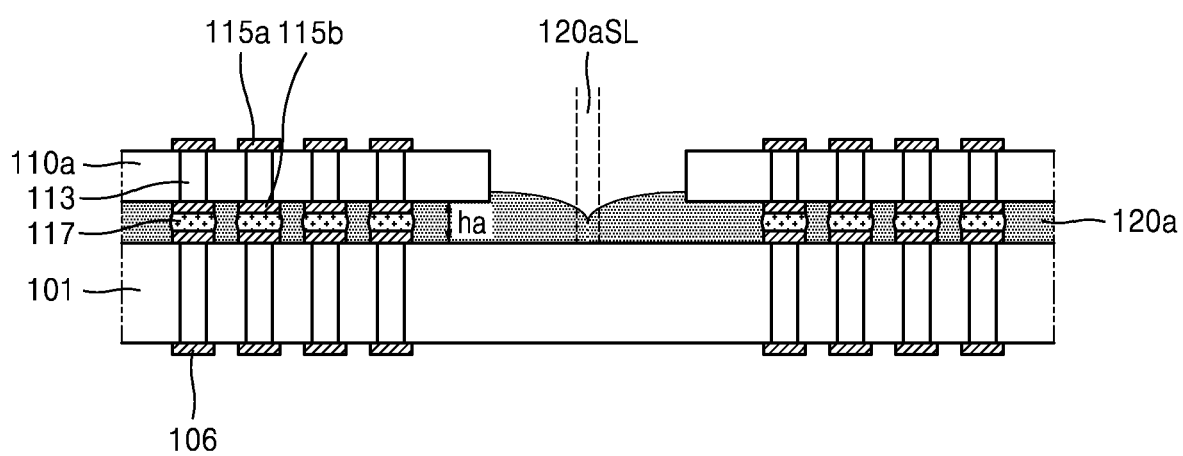
FIG. 6 is a side cross-sectional view illustrating a relationship between adjacent semiconductor devices and underfill fillets when a first non-conductive film (NCF) is changed into a first underfill fillet.

FIG. 6 is a side cross-sectional view illustrating a relationship between adjacent semiconductor devices and underfill fillets when the first NCF 120a' is changed into the first underfill fillet 120a.

Referring to FIG. 6, the first underfill fillets 120a are respectively provided to the adjacent two first semiconductor devices 110a. In some embodiments, the adjacent first underfill fillets 120a contact each other and are partially integrated. Then, the first semiconductor devices 110a and the first underfill fillets 120a may be molded by a molding resin. When the first semiconductor devices 110a and the first underfill fillets 120a are molded by the molding resin and then, are separated and singulated along a separation line 120aSL, side surfaces of the first underfill fillets 120a may be exposed from side surfaces of the molding resin.

FIGS. 7A to 7D are partial plan views illustrating processes in which first NCFs 120a'1, 120a'2, 120a'3, and 120a'4 are gradually fluidized in lower portions of a plurality of adjacent first semiconductor devices 110a1, 110a2, 110a3, and 110a4 and contact each other.

Figure 7A:
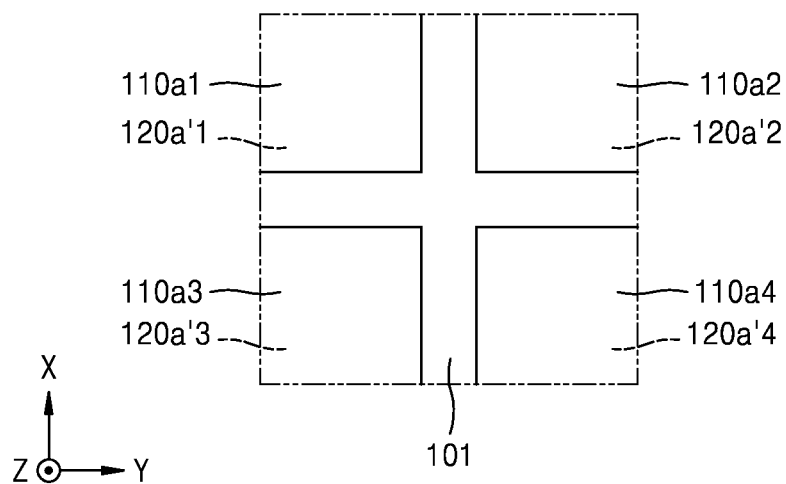
FIGS. 7A to 7D are partial plan views illustrating processes in which first NCFs are gradually fluidized in lower portions of a plurality of adjacent first semiconductor devices and contact each other.

Referring to FIG. 7A, portions of the four first semiconductor devices 110a1, 110a2, 110a3, and 110a4 arranged in a grid configuration are illustrated. The four first semiconductor devices 110a1, 110a2, 110a3, and 110a4 may be respectively attached to the substrate 101 by corresponding first NCFs 120a'1, 120a'2, 120a'3, and 120a'4. Since both surfaces of each of the first NCFs 120a'1, 120a'2, 120a'3, and 120a'4 are adhesive, the first NCFs 120a'1, 120a'2, 120a'3, and 120a'4 may attach the four first semiconductor devices 110a1, 110a2, 110a3, and 110a4 onto the substrate 101.

Figure 7B:
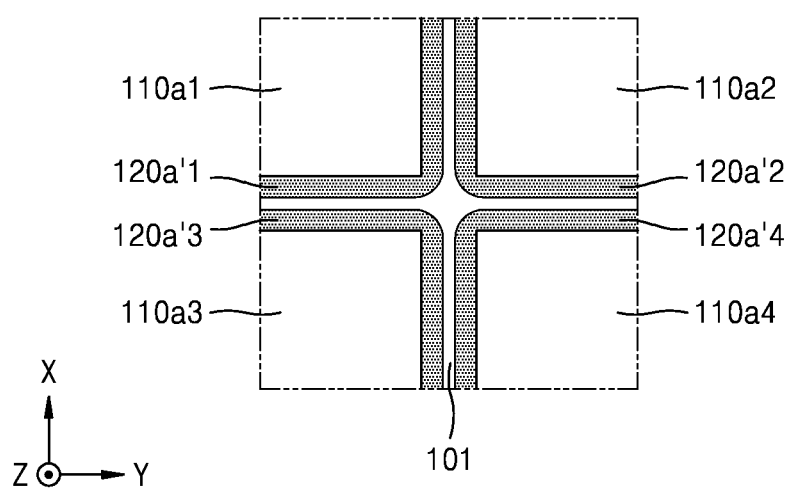

Referring to FIG. 7B, when heat and pressure are applied to the plurality of first semiconductor devices 110a1, 110a2, 110a3, and 110a4, each of the first NCFs 120a'1, 120a'2, 120a'3, and 120a'4 respectively is fluidized and starts to horizontally protrude from the lower portions of the plurality of first semiconductor devices 110a1, 110a2, 110a3, and 110a4.

At this time, although not shown in FIG. 7B, a distance between each of the plurality of first semiconductor devices 110a1, 110a2, 110a3, and 110a4 and the substrate 101 may be reduced and the connection terminals 117 under the plurality of first semiconductor devices 110a1, 110a2, 110a3, and 110a4 may contact corresponding upper pads 106b (refer to FIGS. 5A and 5B) of the substrate 101.

Figure 7C:
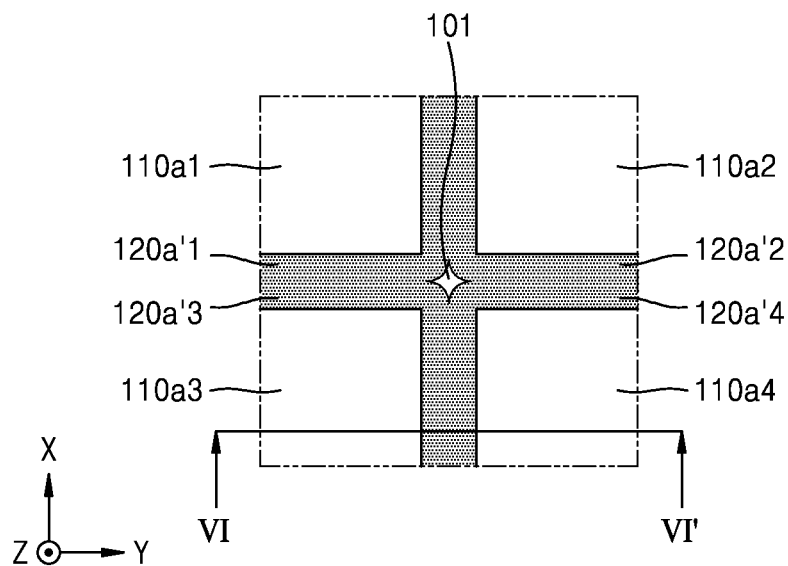

Referring to FIG. 7C, the first NCFs 120a'1, 120a'2, 120a'3, and 120a'4 fluidized by heat are maintained in a fluidized state by continuously applying heat and pressure and horizontally protrude more from the lower portions of the plurality of first semiconductor devices 110a1, 110a2, 110a3, and 110a4. Furthermore, the first NCFs 120a'1, 120a'2, 120a'3, and 120a'4 may be coalesced with adjacent first NCFs 120a'1, 120a'2, 120a'3, and 120a'4.

The cross-section illustrated in FIG. 6 may correspond to the cross-section taken along the line VI-VI' of FIG. 7C.

In FIG. 7C, it is illustrated that the first NCFs 120a'1, 120a'2, 120a'3, and 120a'4 adjacent to each other in the X direction or the Y direction are coalesced with each other. However, in some embodiments, the first NCFs 120a'1, 120a'2, 120a'3, and 120a'4 in a diagonal direction may be coalesced with each other. In some embodiments, at a common corner of the first NCFs 120a'1, 120a'2, 120a'3, and 120a'4, the substrate 101 may be still exposed.

Then, the plurality of second semiconductor devices 110b, the plurality of third semiconductor devices 110c, and the plurality of fourth semiconductor devices 110d may be sequentially stacked on corresponding ones of the plurality of first semiconductor devices 110a1, 110a2, 110a3, and 110a4 by a similar method.

Figure 7D:
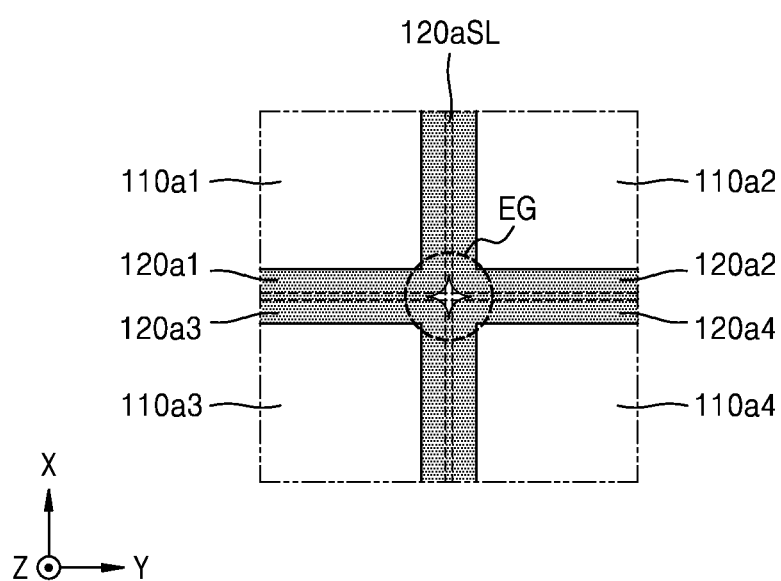

Referring to FIG. 7D, a molding resin is formed and then, is singulated along the separation line 120aSL to obtain a separate semiconductor package. At this time, as described above, at the common corner (marked with EG) of the first NCFs 120a'1, 120a'2, 120a'3, and 120a'4, the substrate 101 may be exposed without being covered with the first NCFs 120a'1, 120a'2, 120a'3, and 120a'4. In such a portion, a molding resin may directly contact the substrate 101.

Such a portion may be observed in the cross-section illustrated in FIG. 1B. That is, referring back to FIG. 1B, in the outside of a portion in which the substrate 101 contacts the first underfill fillet 120a, the substrate 101 may contact the molding resin 140.

Figure 5C:
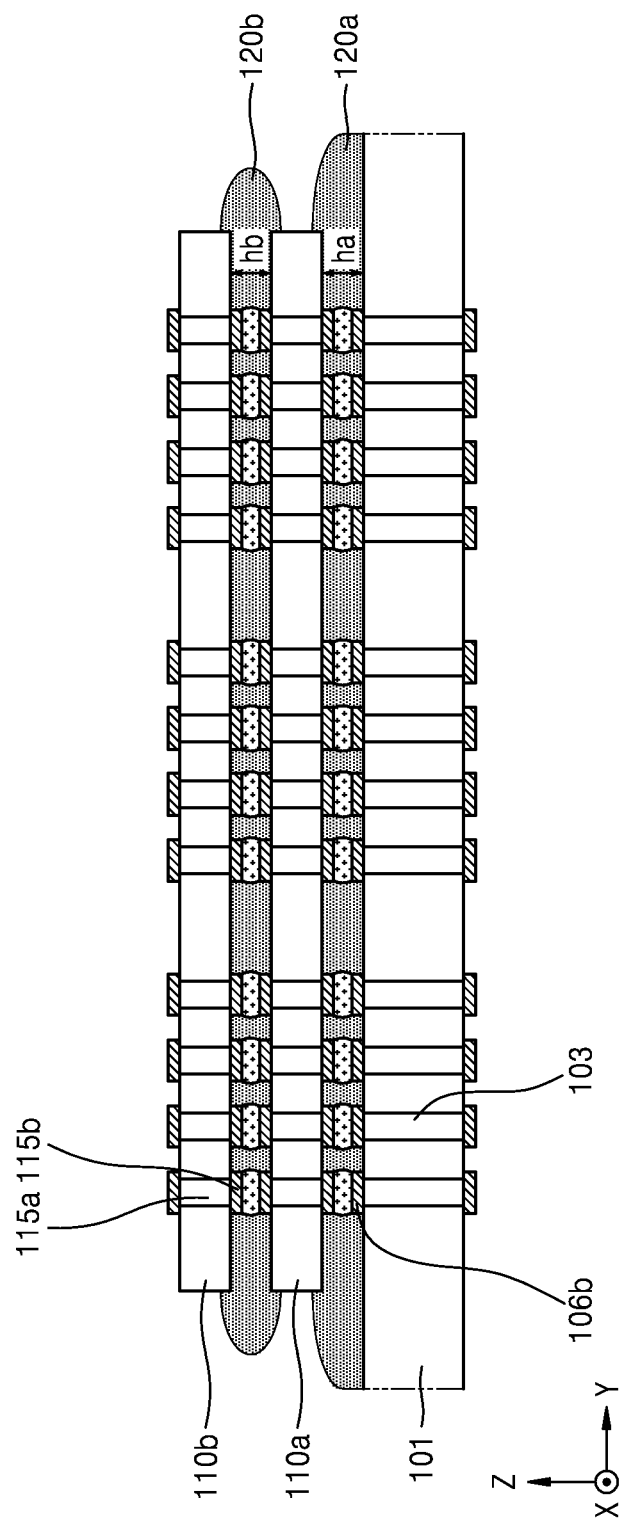

Referring to FIGS. 4 and 5c, each of the plurality of second semiconductor devices 110b is mounted on the corresponding ones of the plurality of first semiconductor devices 110a under a second mounting condition in operation S120.

Each of the second non-conductive films may be attached to each of the plurality of second semiconductor devices 110b. When the plurality of second semiconductor devices 110b are completely mounted under the second mounting condition, the second non-conductive films may be changed into the second underfill fillet 120b.

In some embodiments, the second non-conductive films are substantially the same as the first non-conductive film 120a'. In other embodiments, the second non-conductive films have at least one physical property that is different from that of the first non-conductive film 120a'.

In an exemplary embodiment, the second distance hb between the first semiconductor device 110a and the second semiconductor device 110b is different from the first distance ha between the substrate 101 and the first semiconductor device 110a. In some embodiments, the second distance hb may be greater than the first distance ha.

Figure 5D:
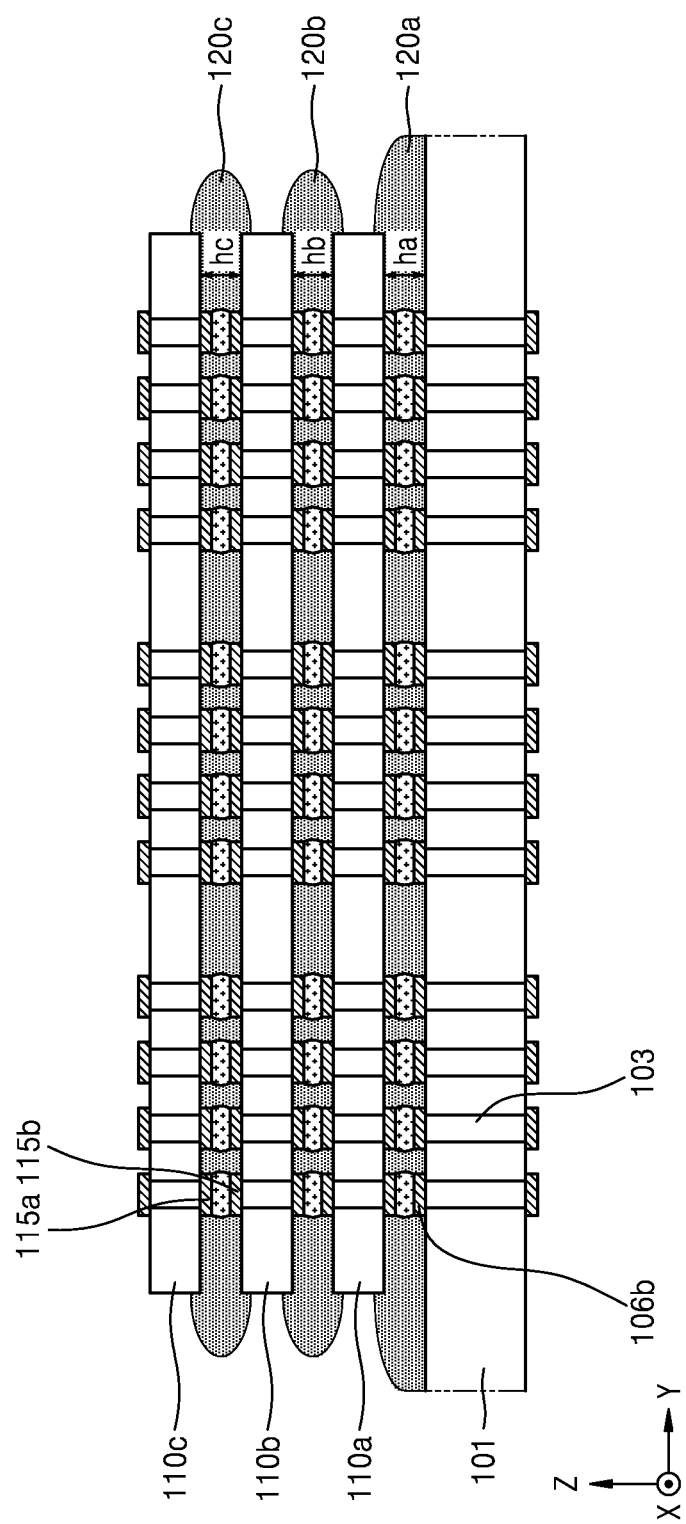

Referring to FIGS. 4 and 5D, each of the plurality of third semiconductor devices 110c are mounted on the corresponding ones of the plurality of second semiconductor devices 110b under a third mounting condition in operation S130.

Each of the third non-conductive films may be attached to each of the plurality of third semiconductor devices 110c. When the plurality of third semiconductor devices 110c have been mounted under the third mounting condition, the third non-conductive films may be changed into the third underfill fillet 120c.

In some embodiments, the third non-conductive films may be substantially the same as the first non-conductive film 120a' and/or the second non-conductive film. In other embodiments, the third non-conductive films may have at least one physical property that is different from that of at least one of the first non-conductive film 120a' and the second non-conductive film.

In an exemplary embodiment, the third distance hc between the second semiconductor device 110b and the third semiconductor device 110c is different from at least one of the first distance ha and the second distance hb. In an exemplary embodiment, the third distance hc is greater than the first distance ha.

Figure 5E:
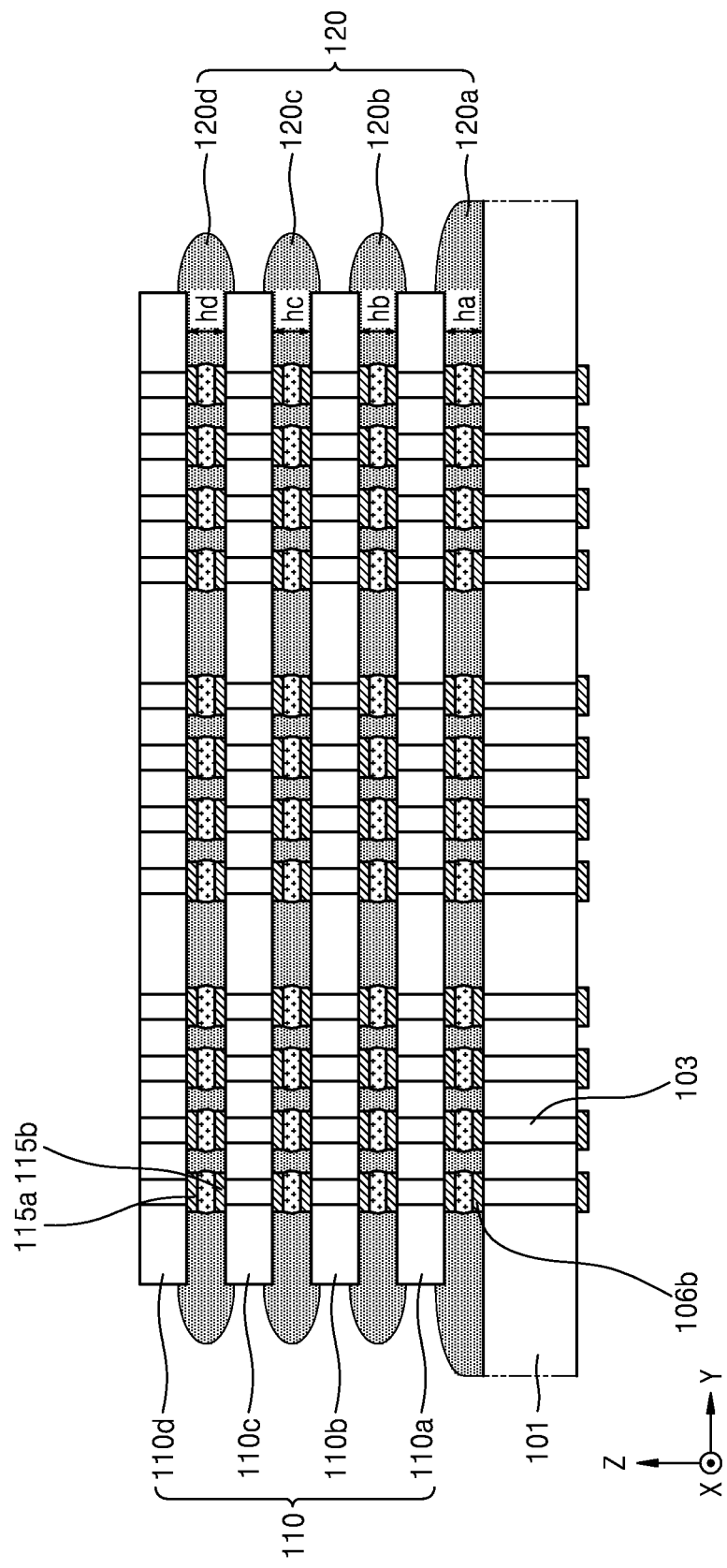

Referring to FIGS. 4 and 5E, each of the plurality of fourth semiconductor devices 110d is mounted on the corresponding ones of the plurality of third semiconductor devices 110c under a fourth mounting condition in operation S140.

Each of the fourth non-conductive films may be attached to each of the plurality of fourth semiconductor devices 110d. When the plurality of fourth semiconductor devices 110d have been mounted under the fourth mounting condition, the fourth non-conductive films may be changed into the fourth underfill fillet 120d.

In some embodiments, the fourth non-conductive films may be substantially the same as the first non-conductive film 120a' to the third non-conductive film. In other embodiments, the fourth non-conductive films may have at least one physical property that is different from at least one of the first non-conductive film 120a' to the third non-conductive film.

In an exemplary embodiment, the fourth distance hd between the third semiconductor device 110c and the fourth semiconductor device 110d is different from at least one of the first distance ha to the third distance hc. In some embodiments, the fourth distance hd may be greater than the first distance ha.

Each of the second mounting condition, the third mounting condition, and the fourth mounting condition includes a temperature, pressure, and time during which each of the second semiconductor device 110b, the third semiconductor device 110c, and the fourth semiconductor device 110d is mounted.

In some embodiments, the temperature of each of the first to third mounting conditions may be about 180° C. to about 280° C. In some embodiments, the pressure of each of the first to third mounting conditions may be about 5 kPa to about 200 kPa. The time of each of the first to third mounting conditions may be about 1 second to about 100 seconds. Since correlation among the temperature, pressure, and time has been described in detail with reference to FIG. 5B, additional description thereof will be omitted.

In the processes described with reference to FIGS. 5B to 5E, it is illustrated that the neighboring first underfill fillets 120a contact each other. However, the neighboring first underfill fillets 120a do not have to contact each other. In other embodiments, the plurality of first semiconductor devices 110a to the fourth semiconductor devices 110d may be mounted so that at least one of the first underfill fillets 120a to the fourth underfill fillets 120d contact neighboring underfill fillets.

Figure 5F:
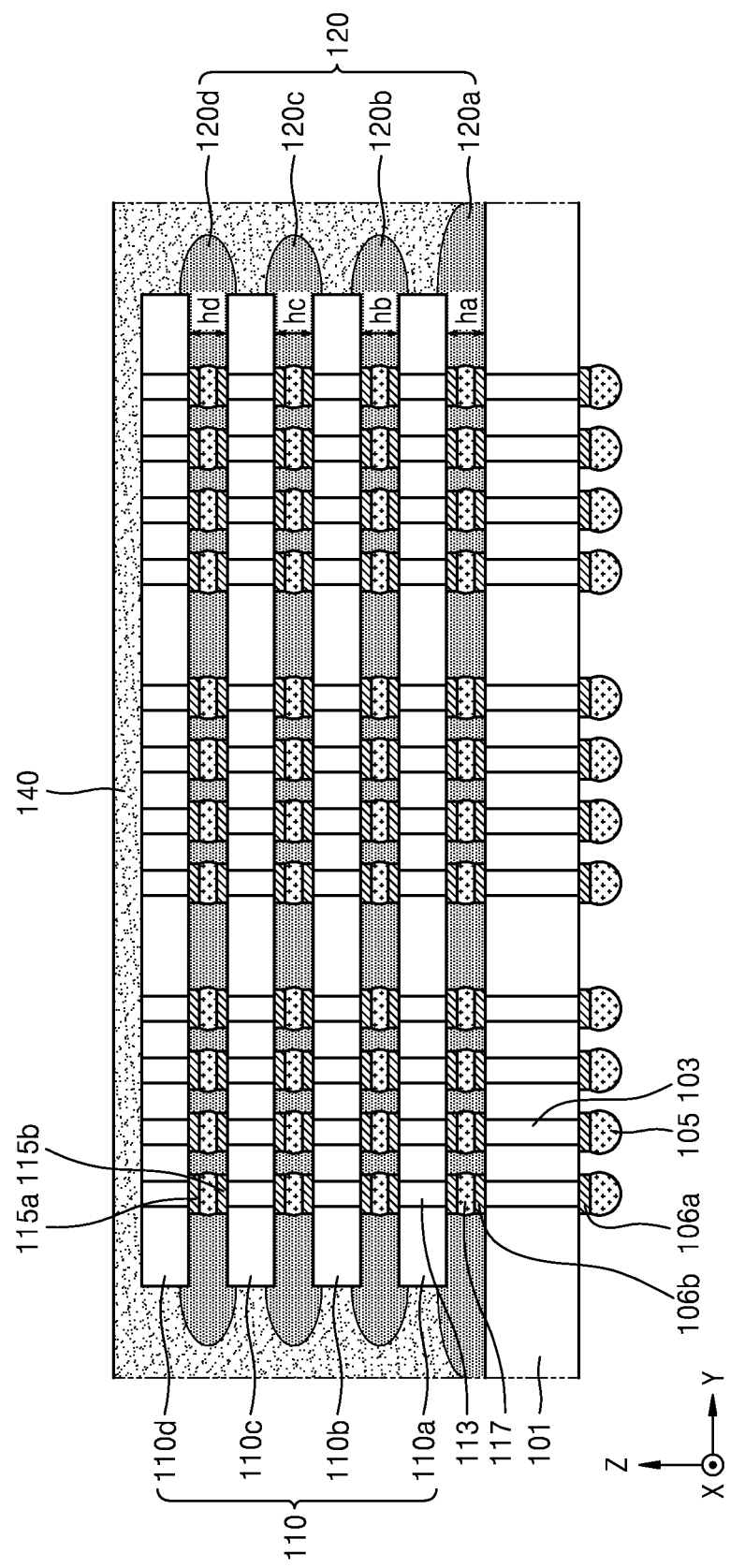

Referring to FIGS. 4 and 5F, the molding resin 140 is formed so as to surround side surfaces of the first semiconductor device 110a to the fourth semiconductor device 110d in operation S150.

In an exemplary embodiment, an upper surface of the fourth semiconductor device 110d is coated with the molding resin 140. In other embodiments, the molding resin 140 may expose the upper surface of the fourth semiconductor device 110d. For example, a portion of the molding resin 140 covering the upper surface may be removed to expose the upper surface.

Since the molding resin 140 has been described in detail with reference to FIGS. 1A and 1B, a detailed description thereof will be omitted.

Figure 5G:
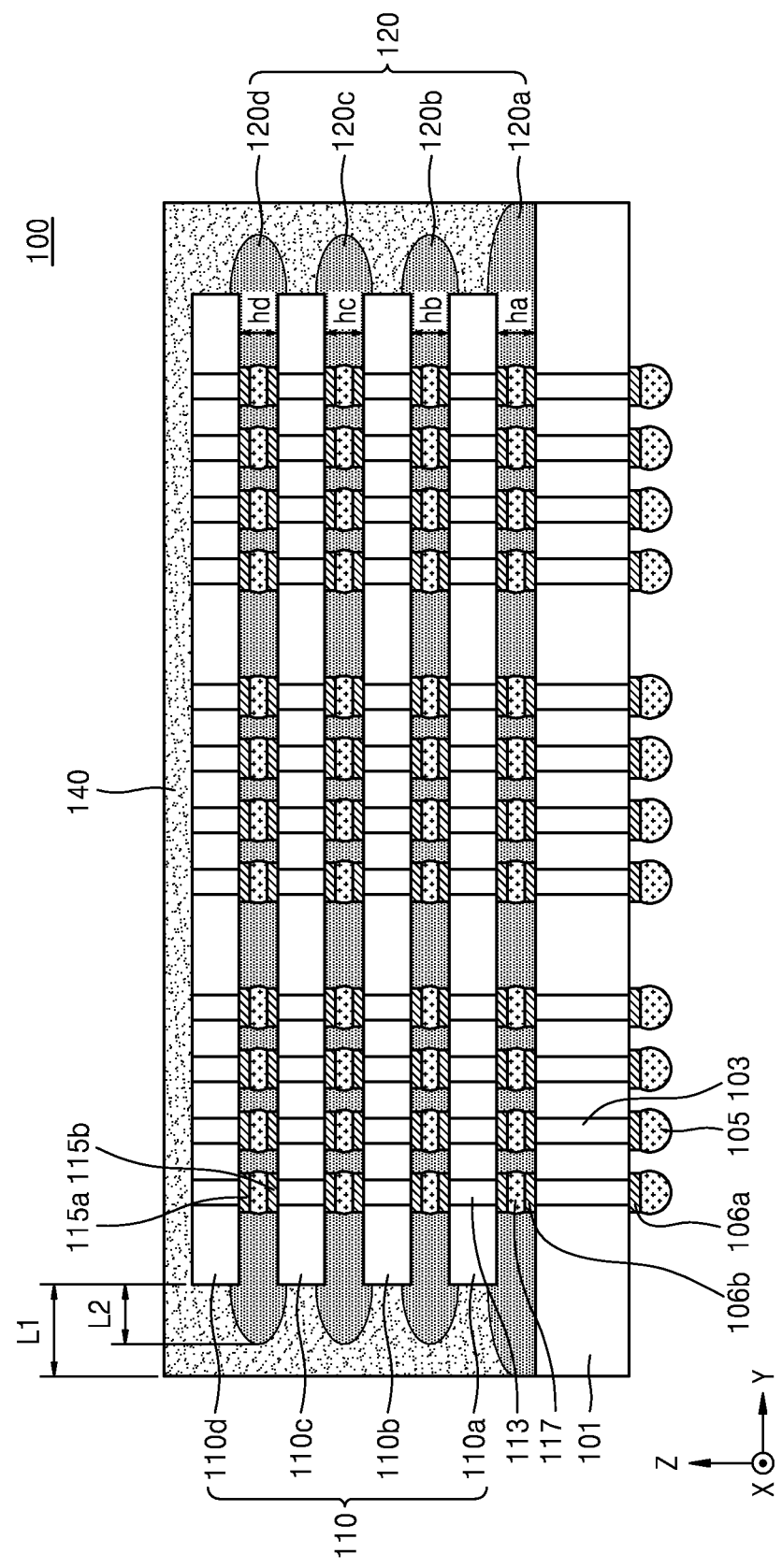

Referring to FIGS. 4 and 5G, through dicing, singulation is performed to obtain the individual semiconductor package 100 in operation S160.

The dicing method may be performed by mechanical sawing or laser sawing. However, the inventive concept is not limited thereto.

When singulation is performed, the molding resin 140 is cut off along the separation line 120aSL as illustrated in FIGS. 6 and 7D so that the first underfill fillet 120a may be exposed from the side surfaces of the molding resin 140.

Figure 8:
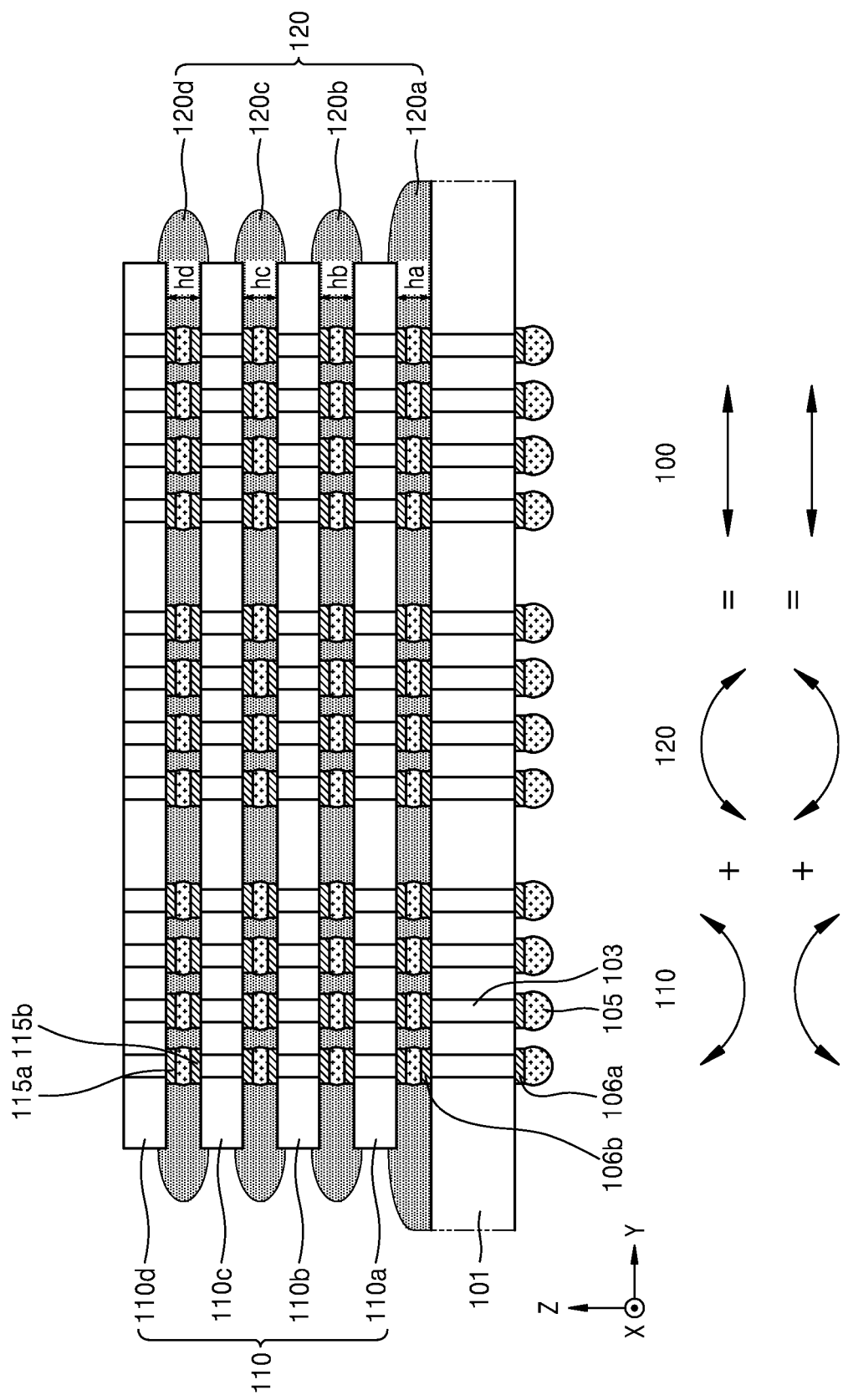
FIG. 8 is a schematic view illustrating adjustment of a warpage characteristic of a semiconductor package.

FIG. 8 is a schematic view illustrating a warpage control of the semiconductor package 100.

Referring to FIG. 8, when the semiconductor devices 110 are bent in the form of a smile (that is, in U-shape), the warpage property of the underfill fillets is controlled to form a cry shape (that is, in reversed U-shape) so that the warpage of the overall semiconductor package 100 may be minimized.

To the contrary, when the warpages of the semiconductor devices 110 are in the form of cry (that is, in reversed U-shape), the warpage property of the underfill fillets is controlled to form a smile shape (that is, in U-shape) so that the warpage of the overall semiconductor package 100 may be minimized.

The temperature, pressure, and time of the above-described first to fourth mounting conditions may be determined to minimize the warpage of the semiconductor package 100. Further, properties of the non-conductive films for forming the first to fourth underfill fillets 120a, 120b, 120c, and 120d may be determined so that the warpage of the semiconductor package 100 is minimized.

By controlling the first to fourth mounting conditions, degrees to which the first to the fourth underfill fillets 120a, 120b, 120c, and 120d horizontally protrude may be controlled. Therefore, electrical connection among the semiconductor devices 110 may be ensured and the warpage of the semiconductor package 100 may be controlled.

As described above, the warpage of the semiconductor package 100 may be controlled by controlling the degrees to which the first to fourth underfill fillets 120a, 120b, 120c, and 120d horizontally protrude considering that a property of an underfill fillet horizontally protruding more is attributed more to the warpage of the semiconductor package 100.

Figure 9:
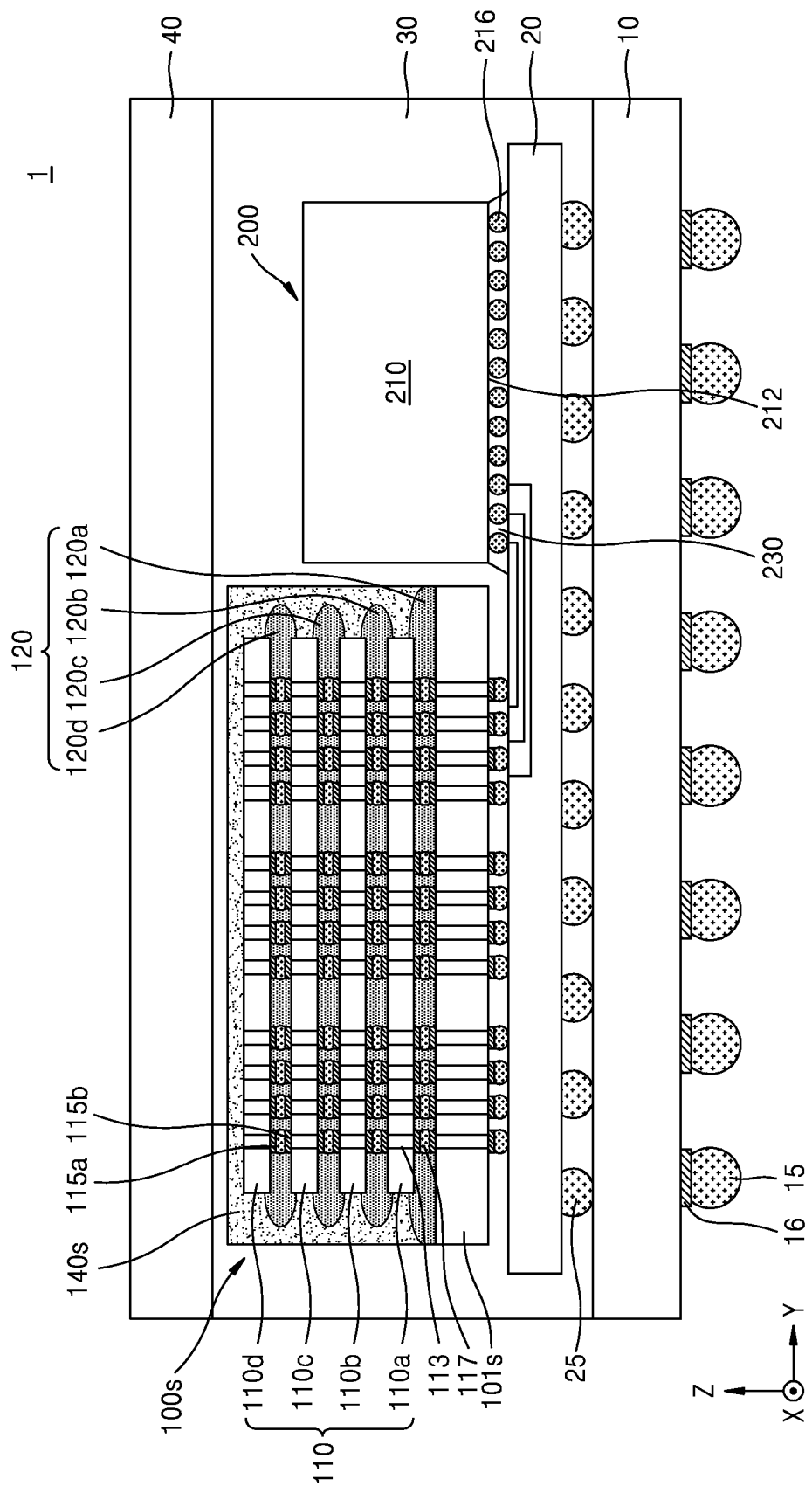
FIG. 9 is a side cross-sectional view illustrating a semiconductor package according to an exemplary embodiment of the inventive concept.

FIG. 9 is a side cross-sectional view illustrating a semiconductor package 1 according to an exemplary embodiment of the inventive concept.

Referring to FIG. 9, an interposer substrate 20 is positioned on a package substrate 10 and a first sub-package 100s and a second sub-package 200 are horizontally arranged on the interposer substrate 20. The first sub-package 100s and the second sub-package 200 may be encapsulated by a first molding resin 30.

The first sub-package 100s may be the same as the semiconductor package 100 described with reference to FIG. 1A and a detailed description thereof will be omitted. A first sub-package substrate 101s of the first sub-package 100s may be the same as the substrate 101 described with reference to FIG. 1A.

The second sub-package 200 includes a first semiconductor chip 210. The first semiconductor chip 210 may be attached onto the interposer substrate 20 so that an active surface 212 faces the interposer substrate 20. The first semiconductor chip 210 may be electrically connected to the interposer substrate 20 via first connection terminals 216 arranged on the active surface 212. The first connection terminals 216 may be, for example, solder balls or bumps. A first underfill material layer 230 may be formed so as to fill a space between the second sub-package 200 and the interposer substrate 20. The first underfill material layer 230 may be formed of, for example, epoxy resin. The first underfill material layer 230 may be a part of the first molding resin 30 formed by, for example, an MUF method. The second sub-package 200 may be, for example, a wafer level package (WLP).

The first semiconductor chip 210 may be a processor unit (e.g., a central processing unit). The first semiconductor chip 210 may be a micro-processor unit (MPU) or a graphic processor unit (GPU).

A semiconductor substrate that forms the first semiconductor chip 210 may include, for example, silicon (Si). Alternatively, the semiconductor substrate that forms the first semiconductor chip 210 may include a semiconductor element such as germanium (Ge) or a compound semiconductor such as silicon carbide (SiC), gallium arsenide (GaAs), indium arsenide (InAs), or indium phosphide (InP). Alternatively, the semiconductor substrate that forms the first semiconductor chip 210 may have a silicon on insulator (SOI) structure. For example, the semiconductor substrate that forms the first semiconductor chip 210 may include a buried oxide layer (BOX). The semiconductor substrate that forms the first semiconductor chip 210 may include a conductive region, for example, an impurity doped well. The semiconductor substrate that forms the first semiconductor chip 210 may have various device isolation structures such as a shallow trench isolation (STI) structure.

In the first semiconductor chip 210, a semiconductor device including various kinds of a plurality of individual devices may be formed. The plurality of individual devices may include microelectronic devices, for example, a metal-oxide-semiconductor field effect transistor (MOSFET) such as a complementary metal-insulator-semiconductor (CMOS) transistor, an image sensor such as a system large scale integration (LSI) or a CMOS imaging sensor (CIS), a micro-electro-mechanical system (MEMS), an active device, and a passive device. The plurality of individual devices may be electrically connected to the conductive region of the semiconductor substrate that forms the first semiconductor chip 210. The semiconductor device may further include at least two of the plurality of individual devices or a conductive wiring line or a conductive plug electrically connecting the plurality of individual devices to the conductive region of a semiconductor substrate forming the first semiconductor chip 210. In addition, the plurality of individual devices may be electrically isolated from neighboring other individual devices by an insulating layer.

The first sub-package 100s and the second sub-package 200 may be mounted on the interposer substrate 20.

The interposer substrate 20 may include a base substrate formed of a semiconductor material and upper pads and lower pads respectively formed on an upper surface and a lower surface of the base substrate. The base substrate may be formed of, for example, a silicon wafer or a glass substrate. In addition, an internal wiring line may be formed on the upper and/or lower surfaces of the base substrate and/or in the base substrate. In addition, in the base substrate, through vias electrically connecting the upper pads to the lower pads may be formed.

The interposer substrate 20 may be mounted on the package substrate 10 by connection terminals 25. The connection terminals 25 may be, for example, solder balls or bumps.

The package substrate 10 may be, for example, a printed circuit board (PCB). The package substrate 10 may include a base substrate and upper pads and lower pads 16 respectively formed on an upper surface and lower surface thereof. The upper pads and lower pads 16 may be exposed by a solder resist layer with which an upper surface and a lower surface of the base substrate are covered.

The upper pads and lower pads 16 may have the same configuration as that of the upper pads 106b and the lower pads 106a described with reference to FIG. 1A and a detailed description thereof will be omitted. In addition, the base substrate may have the same configuration as that of the base substrate described with reference to FIG. 1A and detailed description thereof will be omitted.

External connection terminals 15 may be attached onto the lower surface of the package substrate 10. The external connection terminals 15 may be attached onto, for example, the lower pads 16. The external connection terminals 15 may be, for example, solder balls or bumps. The external connection terminals 15 may electrically connect the semiconductor package 1 to an external device.

The first molding resin 30 surrounding side surfaces of each of the first sub-package 100s and the second sub-package 200 may be further formed on the package substrate 10. The first molding resin 30 may be formed of, for example, EMC. The first molding resin 30 may be separately formed from the molding resin of the first sub-package 100s.

In some embodiments, as illustrated in FIG. 9, an upper surface of the first sub-package 100s may be covered with the first molding resin 30. However, in other embodiments, the upper surface of the first sub-package 100s is not covered with the first molding resin 30. For example, an upper surface of the fourth semiconductor device 110d that is the uppermost semiconductor device among the plurality of semiconductor devices 110 included in the first sub-package 100s is not covered with the first molding resin 30.

In FIG. 9, an upper surface of the second sub-package 200 is illustrated as not being coplanar with the upper surface of the first sub-package 100s. However, the upper surface of the second sub-package 200 may be coplanar with the upper surface of the first sub-package 100s. In this case, the upper surface of the fourth semiconductor device 110d and an upper surface of the first semiconductor chip 210 may be exposed from the first molding resin 30.

A second molding resin 140s surrounding side surfaces of the semiconductor devices 110 of the first sub-package 100s may correspond to the molding resin 140 described with reference to FIG. 1A. The second molding resin 140s may contact the first molding resin 30. In addition, at least one of the first underfill fillet 120a to the fourth underfill fillet 120d may extend to an interface between the second molding resin 140s and the first molding resin 30. In some embodiments, the first underfill fillet 120a to the fourth underfill fillet 120d protrude from side surfaces of the semiconductor devices 110 toward the interface.

A heat dissipation member 40 may be disposed on top of the first sub-package 100s and the second sub-package 200. The heat dissipation member 40 may be, for example, a heat sink, a heat spreader, a heat pipe, or a liquid cooled cold plate.

The heat dissipation member 40 may cover the first sub-package 100s, the second sub-package 200, and the upper surface of the first molding resin 30. In some embodiments, the heat dissipation member 40 may cover the upper surface of the fourth semiconductor device 110d, the upper surface of the first semiconductor chip 210, and the upper surface of the first molding resin 30.

A thermal interface material (TIM) may be provided between the first sub-package 100s and the second sub-package 200 and the heat dissipation member 40. The TIM may be formed of an insulating material or a material capable of maintaining electrical insulation including the insulating material. The TIM may include, for example, epoxy resin. The TIM may be, for example, mineral oil, grease, gap filler putty, phase change gel, phase change material pads, or particle filled epoxy.

Figure 10:
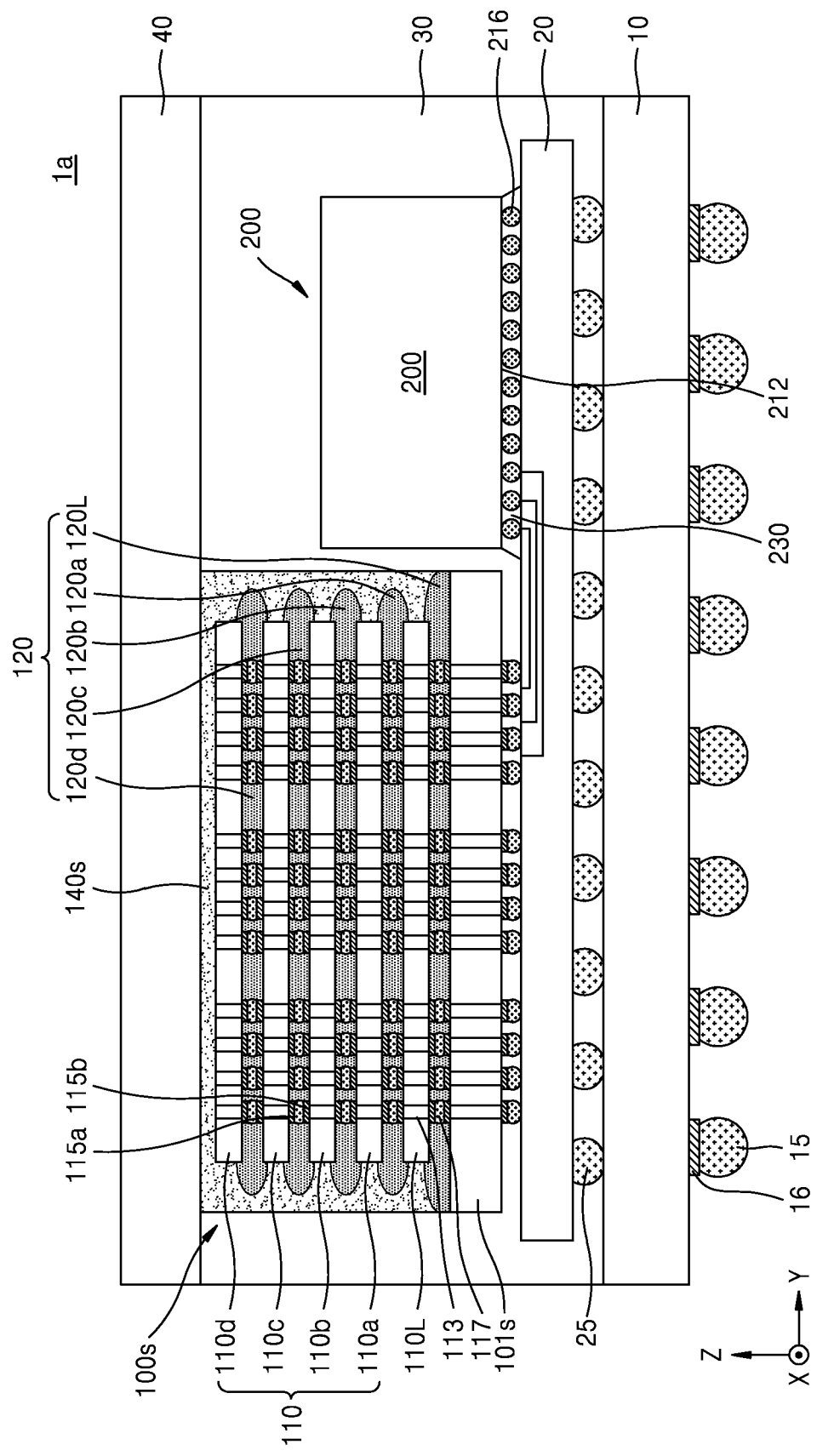
FIG. 10 is a side cross-sectional view illustrating a semiconductor package according to an exemplary embodiment of the inventive concept.

FIG. 10 is a side cross-sectional view illustrating a semiconductor package 1a according to an exemplary embodiment of the inventive concept.

Since the only difference between the semiconductor package 1a of FIG. 10 and the semiconductor package 1 of FIG. 9 lies in a configuration of the first sub-package 100s, such a difference will be mainly described.

The first sub-package 100s furthers include a memory controller 110L (e.g., a control circuit) between the semiconductor device 110 and the first sub-package substrate 101s. A fifth underfill fillet 120L is disposed between the memory controller 110L and the first sub-package substrate 101s.

In this case, at least one of the first to fifth underfill fillets 120a, 120b, 120c, 120d, and 120L may extend to the interface between the second molding resin 140s and the first molding resin 30. Side surfaces of the at least one of the first to fifth underfill fillets 120a, 120b, 120c, 120d, and 120L extending to the interface between the second molding resin 140s and the first molding resin 30 may be coplanar with side surfaces of the first sub-package substrate 101s.

While the inventive concept has been particularly shown and described with reference to embodiments thereof, it will be understood that various changes in form and details may be made therein without departing from the spirit and scope of the disclosure.

What is claimed is:

1. A semiconductor package comprising:
a substrate;
a plurality of semiconductor devices stacked on the substrate;
a plurality of underfill fillets disposed between the plurality of semiconductor devices and between the substrate and the plurality of semiconductor devices; and
a single molding resin surrounding the plurality of semiconductor devices and the plurality of underfill fillets,
wherein at least one of the underfill fillets is exposed from side surfaces of the single molding resin,
wherein each of the underfill fillets protrude from side surfaces of the plurality of semiconductor devices.

2. The semiconductor package of claim 1, wherein the underfill fillets comprise a first underfill fillet disposed between the substrate and the plurality of semiconductor devices, and wherein the first underfill fillet is exposed from side surfaces of the single molding resin.

3. The semiconductor package of claim 2, wherein a distance between side surfaces of the semiconductor devices and side surfaces of the single molding resin is no more than 500 μm.

4. The semiconductor package of claim 2, wherein the plurality of semiconductor devices comprise the first semiconductor device, a second semiconductor device, a third semiconductor device, and a fourth semiconductor device sequentially stacked on the first underfill fillet, wherein the plurality of underfill fillets further comprises a second underfill fillet between the first semiconductor device and the second semiconductor device, a third underfill fillet between the second semiconductor device and the third semiconductor device, and a fourth underfill fillet between the third semiconductor device and the fourth semiconductor device, and wherein at least one of the second underfill fillet, the third underfill fillet, and the fourth underfill fillet is not exposed from side surfaces of the single molding resin.

5. The semiconductor package of claim 4, wherein each of the first to fourth underfill fillets comprises inorganic particles and at least two of the first to fourth underfill fillets comprise different contents of inorganic particles.

6. The semiconductor package of claim 2, wherein a portion of the first underfill fillet exposed from the single molding resin contacts an upper surface of the substrate.

7. The semiconductor package of claim 6, wherein the substrate contacts the single molding resin at corners of the substrate.

8. A semiconductor package comprising:
a package substrate;
an interposer substrate stacked on the package substrate;
a first sub-package and a second sub-package laterally arranged on the interposer substrate; and
a first molding resin surrounding side surfaces of the first sub-package and the second sub-package,
wherein the first sub-package comprises:
a first sub-package substrate;

a plurality of memory devices stacked on the first sub-package substrate; and underfill fillets disposed between the plurality of memory devices and between the first sub-package substrate and the plurality of memory devices, and wherein at least one of the underfill fillets horizontally protrudes from side surfaces of the plurality of memory devices.

9. The semiconductor package of claim 8, wherein the first sub-package further comprises a second molding resin surrounding the plurality of memory devices, and wherein at least one of the underfill fillets extends to an interface between the first molding resin and the second molding resin.

10. The semiconductor package of claim 9, wherein the plurality of memory devices comprise a first memory device, a second memory device, a third memory device, and a fourth memory device sequentially stacked on the first sub-package substrate, and wherein the underfill fillets comprise a first underfill fillet disposed between the first sub-package substrate and the first memory device, a second underfill fillet disposed between the first memory device and the second memory device, a third underfill fillet disposed between the second memory device and the third memory device, and a fourth underfill fillet disposed between the third memory device and the fourth memory device.

11. The semiconductor package of claim 10, wherein a first underfill fillet among the underfill fillets horizontally protrudes most.

12. The semiconductor package of claim 10, wherein the underfill fillets protrude from side surfaces of the plurality of memory devices toward side surfaces of the second molding resin.

13. The semiconductor package of claim 10, wherein at least two of the first to fourth underfill fillets comprise different compositions of inorganic particles.

14. The semiconductor package of claim 10, wherein at least two of the first to fourth underfill fillets have different coefficients of thermal expansion.

15. The semiconductor package of claim 10, wherein at least two of the first to fourth underfill fillets contact each other with an interface interposed therebetween.

16. The semiconductor package of claim 9, wherein side surfaces of the at least one of the underfill fillets extending to an interface between the first molding resin and the second molding resin are coplanar with side surfaces of the first sub-package substrate.

17. The semiconductor package of claim 8, wherein the first sub-package further comprises a memory controller chip disposed between the first sub-package substrate and the plurality of memory devices.

18. The semiconductor package of claim 17, wherein the plurality of memory devices are electrically connected to each other by through silicon vias (TSV).

19. The semiconductor package of claim 8, wherein at least one of the underfill fillets horizontally protrudes from the side surfaces of the plurality of memory devices by about 200 μm to about 500 μm.

20. A semiconductor package comprising:
a package substrate;
a plurality of semiconductor devices stacked on the package substrate;
a plurality of underfill fillets disposed between the plurality of semiconductor devices and between the package substrate and the plurality of semiconductor devices; and
a molding resin surrounding the plurality of semiconductor devices, wherein each of the underfill fillets protrudes to an outside of side surfaces of the plurality of semiconductor devices,
wherein at least one of the underfill fillets is exposed from side surfaces of the molding resin and side surfaces of the underfill fillet exposed from the side surfaces of the molding resin among the underfill fillets are coplanar with the side surfaces of the molding resin.

21. The semiconductor package of claim 20, wherein a distance between side surfaces of the plurality of semiconductor devices and side surfaces of the molding resin is no more than 500 μm.

* * * * *